United States Patent
Inada et al.

(10) Patent No.: US 11,380,725 B2
(45) Date of Patent: Jul. 5, 2022

(54) IMAGING DEVICE AND LAMINATE

(71) Applicant: FUJIFILM Corporation, Tokyo (JP)

(72) Inventors: Hiroshi Inada, Kanagawa (JP); Rie Takasago, Kanagawa (JP); Shigeaki Nimura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 234 days.

(21) Appl. No.: 16/659,580

(22) Filed: Oct. 22, 2019

(65) Prior Publication Data

US 2020/0052028 A1    Feb. 13, 2020

Related U.S. Application Data

(63) Continuation of application No. PCT/JP2018/016553, filed on Apr. 24, 2018.

(30) Foreign Application Priority Data

| Apr. 25, 2017 | (JP) | ............................. JP2017-086295 |
| Jun. 29, 2017 | (JP) | ............................. JP2017-127298 |
| Dec. 25, 2017 | (JP) | ............................. JP2017-247864 |

(51) Int. Cl.
*H01L 31/0232* (2014.01)
*H01L 27/146* (2006.01)
(Continued)

(52) U.S. Cl.
CPC .......... *H01L 27/14629* (2013.01); *G02B 5/30* (2013.01); *G02F 1/133555* (2013.01)

(58) Field of Classification Search
CPC ......... H01L 27/14621; H01L 27/14629; H01L 27/14645; H01L 27/1463; H01L 27/14689;
(Continued)

(56) References Cited

U.S. PATENT DOCUMENTS

| 7,916,167 B2 | 3/2011 | Miyagawa et al. |
| 8,289,617 B2 | 10/2012 | Yamada et al. |
| (Continued) |

FOREIGN PATENT DOCUMENTS

| CN | 1578418 | 2/2005 |
| CN | 200997040 | 12/2007 |
| (Continued) |

OTHER PUBLICATIONS

Office Action of China Counterpart Application, with English translation thereof, dated Mar. 18, 2021, pp. 1-22.
(Continued)

*Primary Examiner* — Brook Kebede
(74) *Attorney, Agent, or Firm* — JCIPRNET

(57) ABSTRACT

Provided are an imaging device that is inconspicuous from the outside, can easily apply design, and can obtain a clear image, and a laminate. The imaging device includes: an imaging unit that includes an image pickup element; and a transflective film that is disposed on a side of the imaging unit where light is incident into the image pickup element and reflects a part of the incident light, in which the transflective film includes at least one of a cholesteric liquid crystal layer or a multi-layer polymer film, when seen from a direction perpendicular to a surface of the image pickup element where light is incident, a peripheral region surrounding the imaging unit satisfies L*≤50 in a CIE-Lab (D50) color space, and when seen from the direction perpendicular to the surface of the image pickup element where light is incident, the transflective film is disposed to cover at least the imaging unit and the peripheral region.

17 Claims, 10 Drawing Sheets

(51) Int. Cl.
*G02B 5/30* (2006.01)
*G02F 1/1335* (2006.01)

(58) Field of Classification Search
CPC ....... H01L 33/20; H01L 33/42; H04N 5/2355; H04N 5/355; H04N 9/0455; G02B 5/30; G02F 1/133555
USPC .......................................................... 257/432
See application file for complete search history.

(56) References Cited

U.S. PATENT DOCUMENTS

| | | | |
|---|---|---|---|
| 8,384,824 | B2 | 2/2013 | Miyagawa et al. |
| 9,398,178 | B2 | 7/2016 | Miyagawa et al. |
| 2007/0115099 | A1 | 5/2007 | Hamada |
| 2010/0026450 | A1 | 2/2010 | Hoshino et al. |
| 2015/0035105 | A1* | 2/2015 | Nakajiki ........... H01L 27/14627 257/432 |
| 2017/0318239 | A1 | 11/2017 | Miyasaka |
| 2018/0106676 | A1 | 4/2018 | Jang et al. |
| 2020/0182698 | A1 | 6/2020 | Jang et al. |

FOREIGN PATENT DOCUMENTS

| | | |
|---|---|---|
| CN | 201203743 | 3/2009 |
| EP | 0648048 | 4/1995 |
| EP | 2685310 | 1/2014 |
| JP | H05161039 | 6/1993 |
| JP | 2000322640 | 11/2000 |
| JP | 2005031170 | 2/2005 |
| JP | 2009015076 | 1/2009 |
| JP | 2014146973 | 8/2014 |
| WO | 02052906 | 7/2002 |
| WO | 2005018997 | 3/2005 |
| WO | 2016117452 | 7/2016 |
| WO | 2016204417 | 12/2016 |

OTHER PUBLICATIONS

"International Search Report (Form PCT/ISA/210) of PCT/JP2018/016553", dated Jul. 3, 2018, with English translation thereof, pp. 1-3.

"Written Opinion of the International Searching Authority (Form PCT/ISA/237) of PCT/JP2018/016553", dated Jul. 3, 2018, with English translation thereof, pp. 1-7.

"Office Action of China Counterpart Application", dated Aug. 18, 2020, with English translation thereof, p. 1-p. 23.

* cited by examiner

IMAGING DEVICE AND LAMINATE

CROSS-REFERENCE TO RELATED APPLICATIONS

This application is a Continuation of PCT International Application No. PCT/JP2018/016553 filed on Apr. 24, 2018, which claims priority under 35 U.S.C. § 119(a) to Japanese Patent Application No. 2017-086295, filed on Apr. 25, 2017, Japanese Patent Application No. 2017-127298, filed on Jun. 29, 2017, and, Japanese Patent Application No. 2017-247864, filed on Dec. 25, 2017. Each of the above applications is hereby expressly incorporated by reference, in its entirety, into the present application.

BACKGROUND OF THE INVENTION

1. Field of the Invention

The present invention relates to an imaging device and a laminate.

2. Description of the Related Art

In a case where the presence of an imaging device such as a surveillance camera is conspicuous, the imaging device may not perform monitoring favorably. For example, a monitoring target may move while avoiding a monitoring range, or may not show a natural reaction. Therefore, the imaging device as a surveillance camera is required to be inconspicuous to a monitoring target.

On the other hand, JP1993-161039A (JP-H5-161039A) discloses a technique of disposing a half mirror on a front surface of a surveillance camera such that the surveillance camera is inconspicuous to a visual recognition target.

In addition, JP2014-146973A discloses a technique of disposing a light transmitting plate such as a smoke plate on a front surface of a hidden camera such that the hidden camera disposed in the light transmitting plate is inconspicuous from the outside.

SUMMARY OF THE INVENTION

However, recently, the use of the imaging device has been widened. For example, in a transport device such as an automobile, the imaging device is used for driving assistance, for example, images a blind spot for a driver to display the obtained image on a display. In addition, in a self-driving technique of an automobile, the imaging device is used as a sensor for allowing a self-driving car to grasp the surrounding environment.

In addition, in robotics of industrial robots, non-industrial robots, and the like, the imaging device is used as a sensor or the like for detecting the surrounding environment.

This way, in a case where the imaging device is used as a sensor in a transport device, a robot, or the like, when the imaging device is conspicuous from the outside, the external appearance deteriorates. Therefore, it is desired that the camera is inconspicuous from the outside.

However, in the configuration in which the half mirror is used such that the imaging device is inconspicuous, the external appearance of the half mirror portion looks like a mirror. Therefore, there is a problem in that it is difficult to apply various designs to the half mirror portion.

In addition, in the configuration in which the smoke plate is used, the color of the smoke plate is transferred to an image obtained by the imaging device. Therefore, there is a problem in that it is difficult to obtain a clear image. For example, in a case where a red smoke plate is used, the entire image becomes reddish.

In addition, the imaging device is also built in a portable device such as a smartphone. In the external appearance of the portable device, the imaging device is conspicuous, and there is a problem in that the design is limited.

The present invention has been made in consideration of the above-described circumstances, and an object thereof is to provide an imaging device that is inconspicuous from the outside, can easily apply design, and can obtain a clear image, and a laminate.

The present inventors conducted thorough investigation on the problems of the related art and found that the above-described object can be achieved with an imaging device including: an imaging unit that includes an image pickup element; and a transflective film that is disposed on a side of the imaging unit where light is incident into the image pickup element and reflects a part of the incident light, in which the transflective film includes at least one of a cholesteric liquid crystal layer or a multi-layer polymer film, when seen from a direction perpendicular to a surface of the image pickup element where light is incident, a peripheral region surrounding the imaging unit satisfies $L^* \leq 50$ in a CIE-Lab (D50) color space, and when seen from the direction perpendicular to the surface of the image pickup element where light is incident, the transflective film is disposed to cover the imaging unit and the peripheral region.

That is, the present inventors found that the objects can be achieved with the following configurations.

(1) An imaging device comprising:

an imaging unit that includes an image pickup element; and a transflective film that is disposed on a side of the imaging unit where light is incident into the image pickup element and reflects a part of the incident light, in which the transflective film includes at least one of a cholesteric liquid crystal layer or a multi-layer polymer film, when seen from a direction perpendicular to a surface of the image pickup element where light is incident, a peripheral region surrounding the imaging unit satisfies $L^* \leq 50$ in a CIE-Lab (D50) color space, and when seen from the direction perpendicular to the surface of the image pickup element where light is incident, the transflective film is disposed to cover at least the imaging unit and the peripheral region.

(2) The imaging device according to (1), in which the transflective film includes a cholesteric liquid crystal layer.

(3) The imaging device according to (1) or (2), further comprising:

a blocking member that is disposed between the imaging unit and the transflective film and has an opening at a position of the imaging unit when seen from the direction perpendicular to the surface of the image pickup element where light is incident, a peripheral region of the opening in the blocking member satisfies $L^* \leq 50$ in the CIE-Lab (D50) color space, and the transflective film is disposed to cover at least the opening and the peripheral region of the blocking member.

(4) The imaging device according to (3), in which the blocking member is in contact with a layer on the transflective film side.

(5) The imaging device according to (3) or (4), further comprising:

a reflection uniformizing layer that is disposed between the blocking member and the transflective film.

(6) The imaging device according to (1) or (2), further comprising:

a box-shaped member that covers a surface side of the imaging unit opposite to the surface where light is incident into the image pickup element and a side surface side of the imaging unit and has one open surface, and when seen from the direction perpendicular to the surface of the image pickup element where light is incident, a region of the box-shaped member corresponding to the peripheral region satisfies $L^* \leq 50$ in the CIE-Lab (D50) color space.

(7) The imaging device according to any one of (1) to (6), further comprising:

an antireflection layer that is disposed on the surface side of the imaging unit where light is incident into the image pickup element.

(8) The imaging device according to any one of (1) to (7), further comprising:

a $\lambda/4$ plate and a linear polarizing plate that are disposed on the surface side of the imaging unit where light is incident into the image pickup element.

(9) The imaging device according to (8), in which in a case where a phase difference at an incidence angle $\theta°$ is represented by Re ($\theta$) and an absolute value of a difference between a value of $\frac{1}{4} \times \lambda$ at an incidence wavelength $\lambda$ nm and a value of the phase difference is represented by $|\Delta Re (\theta)|=|\frac{1}{4} \times \lambda - Re (\theta)|$, the $\lambda/4$ plate constantly satisfies $|\Delta Re (\theta)|<50$ at any wavelength of 400 nm to 700 nm.

(10) The imaging device according to (8) or (9), in which in a case where a phase difference at an incidence angle $\theta°$ is represented by Re ($\theta$) and an absolute value of a difference between a value of $\frac{1}{4} \times \lambda$ at an incidence wavelength $\lambda$ nm and a value of the phase difference is represented by $|\Delta Re (\theta)|=|\frac{1}{4} \times \lambda - Re (\theta)|$, the $\lambda/4$ plate constantly satisfies $|\Delta Re (60)|<50$ at any wavelength of 400 nm to 700 nm, and in a case where a phase difference at an incidence angle $\theta°$ and an incidence wavelength $\lambda$ nm is represented by $\Delta Re (\theta,\lambda)$ and an absolute value of a difference between a value of $\frac{1}{4} \times \lambda$ at each wavelength and a value of the phase difference of the film is represented by $|\Delta Re (\theta,\lambda)|=|\frac{1}{4} \times \lambda - Re (\theta,\lambda)|$, the $\lambda/4$ plate satisfies $|\Delta Re (60,450)|<|\Delta Re (60,650)|$.

(11) The imaging device according to any one of (1) to (10), in which the transflective film includes a cholesteric liquid crystal layer, and the imaging device further comprises a circularly polarizing plate that is disposed between the blocking member and the transflective film.

(12) The imaging device according to (11), in which in a case where a circular polarization degree of the circularly polarizing plate at an incidence angle $\theta°$ is represented by D ($\theta$) and an absolute value of the circular polarization degree is represented by $|D (\theta)|$, the circularly polarizing plate constantly satisfies $|D (0)|>0.8$ at any wavelength of 400 nm to 700 nm.

(13) The imaging device according to (11) or (12), in which in a case where a circular polarization degree of the circularly polarizing plate at an incidence angle $\theta°$ is represented by D ($\theta$) and an absolute value of the circular polarization degree is represented by $|D (\theta)|$, the circularly polarizing plate constantly satisfies $|D (60)|>0.8$ at any wavelength of 400 to 700 nm, and in a case where a circular polarization degree of the circularly polarizing plate at an incidence angle $\theta°$ and an incidence wavelength $\lambda$ nm is represented by D ($\theta,\lambda$) and an absolute value of the circular polarization degree is represented by $|D (\theta,\lambda)|$, the circularly polarizing plate constantly satisfies $|D (60,450)|>|D (60,650)|$.

(14) The imaging device according to any one of (8) to (13), further comprising a second $\lambda/4$ plate that is disposed between the imaging unit and the linear polarizing plate or the circularly polarizing plate.

(15) The imaging device according to (14), further comprising an antireflection layer or a reflection uniformizing layer that is disposed between the imaging unit and the second $\lambda/4$ plate.

(16) The imaging device according to any one of (1) to (15), wherein the transflective film includes a cholesteric liquid crystal layer, and the cholesteric liquid crystal layer includes two or more reflecting regions having different selective reflection wavelengths.

(17) A laminate comprising:

a blocking member having at least one opening; and a transflective film, in which the transflective film includes at least one of a cholesteric liquid crystal layer or a multi-layer polymer film, when seen from a direction perpendicular to a principal plane of the blocking member, a peripheral region surrounding the opening satisfies $L^* \leq 50$ in a CIE-Lab (D50) color space.

According to the present invention, it is possible to provide an imaging device that is inconspicuous from the outside, can easily apply design, and can obtain a clear image, and a laminate.

DESCRIPTION OF THE PREFERRED EMBODIMENTS

Figure 1:
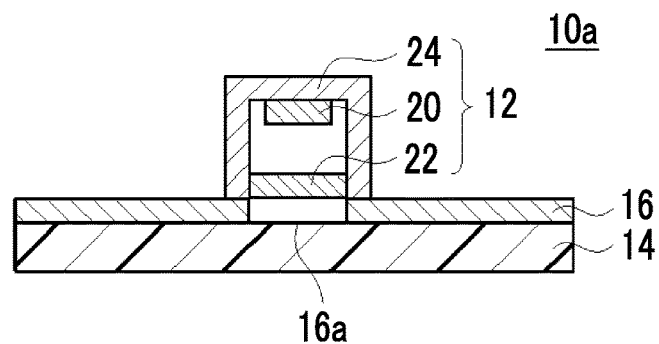
FIG. 1 is a cross-sectional view schematically illustrating one example of an imaging device according to the present invention.

Hereinafter, the details of an imaging device according to an embodiment of the present invention will be described. In this specification, numerical ranges represented by "to"" include numerical values before and after "to" as lower limit values and upper limit values.

In addition, in this specification, the meaning of "perpendicular" or "parallel" includes a range of error that is allowable in the technical field belonging to the present invention. For example, "perpendicular" or "parallel" is within a range of ±10° with respect to the exact "perpendicular" or "parallel", and the error with respect to the exact "perpendicular" or "parallel" is preferably 5° or less and more preferably 3° or less.

In addition, in this specification, a specific angle such as 15° or 45° other than "perpendicular" or "parallel" includes a range of error that is allowable in the technical field belonging to the present invention. For example, in the present invention, the angle is within a range of ±5° with respect to the exact angle, and the error with respect to the exact angle is preferably ±3° or less and more preferably ±1° or less.

In this specification, "(meth)acrylate" represents "either or both of acrylate and methacrylate".

In this specification, the meaning of "the same" includes a case where an error range is generally allowable in the technical field. In addition, in this specification, the meaning of "all", "entire", or "entire surface" includes not only 100% but also a case where an error range is generally allowable in the technical field, for example, 99% or more, 95% or more, or 90% or more.

Visible light refers to light having a wavelength which can be observed by human eyes among electromagnetic waves and refers to light in a wavelength range of 380 nm to 780 nm. Invisible light refers to light in a wavelength range of shorter than 380 nm or longer than 780 nm.

In addition, although not limited thereto, in visible light, light in a wavelength range of 420 nm to 490 nm refers to blue light, light in a wavelength range of 495 nm to 570 nm refers to green light, and light in a wavelength range of 620 nm to 750 nm refers to red light.

Among infrared light rays, near infrared light refers to an electromagnetic wave in a wavelength range of 780 nm to 2500 nm. Ultraviolet light refers to light in a wavelength range of 10 to 380 nm.

In this specification, a selective reflection wavelength refers to an average value of two wavelengths at which, in a case where a minimum value of a transmittance of a target object (member) is represented by Tmin (%), a half value transmittance: T½ (%) represented by the following expression is exhibited.

Expression for obtaining Half Value Transmittance:
$T½=100-(100-T min)÷2$

In this specification, the refractive index refers to a refractive index with respect to light having a wavelength of 589.3 nm.

In this specification, Re ($\lambda$) and Rth ($\lambda$) represent an in-plane retardation and a thickness-direction retardation at a wavelength $\lambda$, respectively. Unless specified otherwise, the wavelength $\lambda$, refers to 550 nm.

In this specification, Re ($\lambda$) and Rth ($\lambda$) are values measured at the wavelength $\lambda$ using AxoScan OPMF-1 (manufactured by Opto Science Inc.). By inputting an average refractive index $((Nx+Ny+Nz)/3)$ and a thickness (d (μm) to AxoScan, the following expressions can be calculated.

Slow Axis Direction (°)

$Re(\lambda)=R0(\lambda)$ $Rth(\lambda)=((Nx+Ny)/2-Nz)\times d$

R0 ($\lambda$) is expressed as a numerical value calculated by AxoScan and represents Re ($\lambda$).

In this specification, Re ($\theta$) is a value measured at a wavelength of 550 nm from a direction in which the incidence angle is $\theta$ using AxoScan OPMF-1 (manufactured by Opto Science Inc.).

In this specification, Re ($\theta,\lambda$) is a value measured at a wavelength $\lambda$ from a direction in which the incidence angle is $\theta$ using AxoScan OPMF-1 (manufactured by Opto Science Inc.).

In this specification, the refractive indices Nx, Ny, and Nz are measured using an Abbe refractometer (NAR-4T, manufactured by Atago Co., Ltd.), and a sodium lamp ($\lambda$=589 nm) is used as a light source. In addition, the wavelength dependence can be measured using a combination of a multi-wavelength Abbe refractometer DR-M2 (manufactured by Atago Co., Ltd.) and an interference filter.

In addition, as the refractive index, values described in "Polymer Handbook" (John Wiley & Sons, Inc.) and catalogs of various optical films can also be used. The values of average refractive index of major optical films are as follows: cellulose acylate (1.48), cycloolefin polymer (1.52), polycarbonate (1.59), polymethyl methacrylate (1.49), and polystyrene (1.59).

<Imaging Device>

An imaging device according to the present invention comprises:

an imaging unit that includes an image pickup element; and a transflective film that is disposed on a side of the imaging unit where light is incident into the image pickup element and reflects a part of the incident light, in which the transflective film includes at least one of a cholesteric liquid crystal layer or a multi-layer polymer film, when seen from a direction perpendicular to a surface of the image pickup element where light is incident, a peripheral region surrounding the imaging unit satisfies $L^* \leq 50$ in a CIE-Lab (D50) color space, and when seen from the direction perpendicular to the surface of the image pickup element where light is incident, the transflective film is disposed to cover at least the imaging unit and the peripheral region.

Hereinafter, an example of a preferable embodiment of the imaging device according to the present invention will be described with reference to the drawings.

FIG. 1 is a schematic cross-sectional view illustrating one example of the imaging device according to the embodiment of the present invention.

The drawing in the present invention is a schematic diagram, and a thickness relationship or a positional relationship between respective layers does not necessarily match the actual ones. The same shall be applied to the following drawings.

As illustrated in FIG. 1, an imaging device 10a includes: an image pickup element 20; an optical system 22 that forms an image on the image pickup element 20; an imaging unit 12 that includes a lens barrel 24 accommodating the optical system 22; a blocking member 16 having an opening 16a; and a transflective film 14.

[Imaging Unit]

The image pickup element 20 of the imaging unit 12 converts the image formed by the optical system 22 into an electrical signal and outputs the converted electrical signal. As the image pickup element 20, a well-known image pickup element of the related art such as a charge-coupled device (CCD) image sensor or a complementary metal oxide semiconductor (CMOS) image sensor can be appropriately used.

As the electrical signal output from the image pickup element 20, image data on which predetermined processing is performed by an image processing portion (not illustrated) is generated. The generated image data is optionally displayed on a display portion (not illustrated) or is stored in a well-known storage medium.

The image pickup element 20 is formed on an element substrate. In the example illustrated in FIG. 1, the element substrate is illustrated as a member integrated with the lens barrel 24 or but may be a member separated from the lens barrel 24.

In addition, various functional films such as a color filter or an infrared cut filter may be disposed on the image pickup element 20.

The optical system 22 includes at least one lens and is disposed such that an optical axis thereof is perpendicular to a surface of the image pickup element 20. Light transmitted through the optical system 22 is incident into the image pickup element 20.

A configuration of the optical system 22 is not particularly limited and may include two or more lenses.

The lens barrel 24 includes a hole portion having a substantially columnar shape in which the optical system 22 is accommodated and supported. A central axis of the hole portion matches the optical axis of the optical system 22.

In addition, an inner surface of the hole portion of the lens barrel 24 is formed of a light shielding (black) material.

In addition, in the example illustrated in FIG. 1, one end portion side of the hole portion of the lens barrel 24 is blocked, and the image pickup element 20 is disposed on a bottom portion of the lens barrel 24.

In the example illustrated in FIG. 1, the imaging unit 12 is not limited to the configuration including the image pickup element 20, the optical system 22, and the lens barrel 24 as long as it includes at least the imaging unit 12.

[Blocking Member]

The blocking member 16 is disposed between the imaging unit 12 and the transflective film 14 and includes an opening 16a at a position of the imaging unit 12 (optical system 22) when seen from a direction perpendicular to a surface of the image pickup element 20 where light is incident, that is, when seen from an optical axis direction of the optical system 22. The size and shape of the opening 16a are substantially the same as those of the incident surface side of the optical system 22. That is, the blocking member 16 includes the opening 16a through which light incident into the optical system 22 of the imaging unit 12 passes, and is disposed to cover a region surrounding the incident surface side of the optical system 22.

Here, the region (hereinafter, referred to as "peripheral region") surrounding the opening 16a of the blocking member 16 satisfies $L^* \leq 50$ in a CIE-Lab (D50) color space. That is, when seen from the direction perpendicular to the surface of the image pickup element 20 where light is incident, the peripheral region surrounding the imaging unit 12 satisfies $L^* \leq 50$ in the CIE-Lab (D50) color space.

By setting $L^*$ of the peripheral region of the imaging unit 12 to be 50 or less and adjusting the imaging unit 12 (optical system 22) and the peripheral region to cover the transflective film 14, the imaging unit 12 can be made to be inconspicuous from the outside. This point will be described below.

Here, a range of the peripheral region will be described using FIG. 2.

Figure 2:
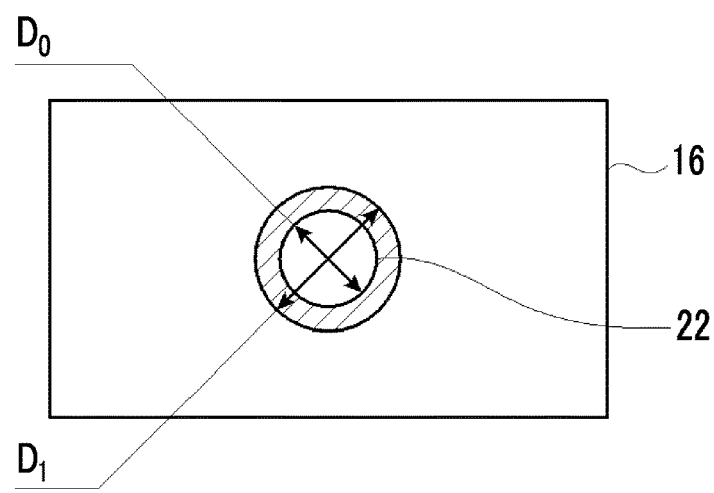
FIG. 2 is a schematic front view illustrating a peripheral region.

FIG. 2 is a diagram illustrating the imaging device 10a excluding the transflective film 14 when seen from the optical axis direction of the optical system 22.

The peripheral region is an annular region including a circumference of a circumscribed circle of the image pickup element 20 as an inner circumference and including a circumference of a circle concentric with the circumscribed circle as an outer circumference. In a case where the diameter of the circumscribed circle of the image pickup element 20 is represented by $D_0$ and the diameter of the outer circumference of the peripheral region is represented by $D_1$, $D_1$ is 1.5 times $D_0$.

CIE-Lab (D50) is a color space defined by the International Commission on Illumination (CIE), $L^*$ corresponds to the lightness of a color, $a^*$ corresponds to the position between red (magenta) and green, and $b^*$ corresponds to the position between yellow and blue. In addition, $L^*=0$ corresponds to black, and $L^*=100$ corresponds to diffuse white. Accordingly, the peripheral region satisfying $L^* \leq 50$ represents that the lightness of the peripheral region is close to black (dark).

$L^*$ represents an average value of obtained by measuring the peripheral region using a general colorimeter, for example, CM-700d or CM-2600d (manufactured by Konica Minolta Inc.)

The blocking member 16 is not limited as long as $L^*$ of the peripheral region satisfies 50 or less and the surface has a color having low lightness, for example, black. For example, members formed of various materials such as a resin film or a metal film can be used. In addition, the surface of the member formed of the above-described material may be colored with a color having a value $L^*$ of 50 or less.

In addition, the blocking member 16 may be a part of a case accommodating the imaging unit 12 or may be a member separated from the case.

In addition, the opening 16a of the blocking member 16 is not particularly limited as long as it allows transmission of light. The opening 16a may be hollow, or a cover member formed of a transparent resin, glass, or the like may be disposed in the opening 16a.

[Transflective Film]

The transflective film 14 is a member that is disposed on a surface side of the blocking member 16 opposite to the imaging unit 12-side surface and reflects a part of the incident light.

The transflective film 14 includes at least one of a multi-layer polymer film or a cholesteric liquid crystal layer so as to reflect a part of the incident light and to allow transmission of a part of the remaining light.

Here, when seen from the optical axis direction of the optical system 22, the transflective film 14 is disposed to cover at least the imaging unit 12 (optical system 22) and the peripheral region.

Figure 3:
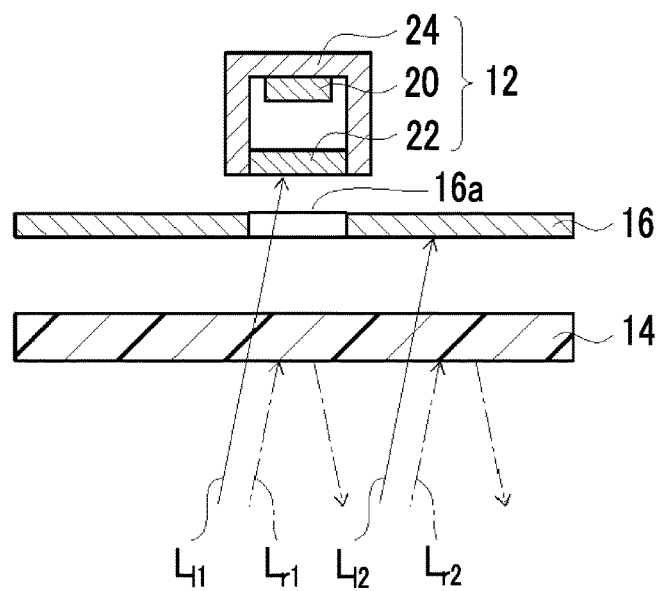
FIG. 3 is a schematic cross-sectional view illustrating an operation of the imaging device illustrated in FIG. 1.

The operation of the imaging device 10a will be described using FIG. 3.

In a case where light is incident from the transflective film 14 side to the imaging unit 12, light $L_{r1}$ as a part of the incidence light is reflected from the transflective film 14. Remaining light $L_{t1}$ of the incidence light transmits through the transflective film 14, passes through the opening 16a of the blocking member 16, and is incident into the optical system 22 of the imaging unit 12. The light $L_{t1}$ incident into the optical system 22 forms an image on (is incident into) the image pickup element 20, and an inner surface of the lens barrel 24 is black for suppressing diffused reflection of light. Therefore, the light $L_{t1}$ is not reflected from the transflective film 14 side (the amount of light reflected is small).

Thus, in a case where the imaging device 10a is seen from the transflective film 14 side, only light (reflected light of the light $L_{r1}$) reflected from the transflective film 14 is observed in a region corresponding to the position of the imaging unit 12.

On the other hand, in a case where light is incident from the transflective film 14 side to the imaging unit 12, light $L_{r2}$ as a part of the incidence light is reflected from the transflective film 14. Remaining light $L_{t2}$ of the incidence light transmits through the transflective film 14 and reaches the blocking member 16.

Here, the peripheral region of the blocking member 16 satisfies $L^* \leq 50$ in the CIE-Lab (D50) color space. That is, since the peripheral region of the blocking member 16 is close to black, the light $L_{t2}$ incident into the blocking member 16 is absorbed by the blocking member 16, and the proportion of light reflected is low.

Thus, in a case where the imaging device 10a is seen from the transflective film 14 side, only light (reflected light of the light $L_{r2}$) reflected from the transflective film 14 is observed in a region corresponding to the position of the blocking member 16 (peripheral region).

Accordingly, in a case where the imaging device 10a is seen from the transflective film 14 side, only reflected light ($L_{r1}$ and $L_{r2}$) reflected from the transflective film 14 is observed both in a region corresponding to the imaging unit 12 and a peripheral region surrounding the region. That is, since the region corresponding to the imaging unit 12 and the peripheral region surrounding the region look the same, the presence of the imaging unit 12 is inconspicuous.

Here, only with the configuration in which the imaging unit is covered with the transflective film, the proportion of light reflected from the transflective film is higher than the amount of light reflected from the imaging unit itself. Therefore, the imaging unit itself is inconspicuous. However, in a case where L* of the peripheral region satisfies is higher than 50 in the CIE-Lab (D50) color space, light that transmits through the transflective film and reaches the blocking member is reflected from the blocking member. Therefore, when the imaging device is seen from the transflective film side, only light reflected from the transflective film and light reflected from the blocking member are observed in a region corresponding to the position of the peripheral region. Therefore, a region corresponding to the imaging unit and a peripheral region surrounding the region look different. Therefore, a boundary between the imaging unit 12 and the peripheral region is easily observed, and the presence of the imaging unit is conspicuous.

On the other hand, the imaging device according to the embodiment of the present invention has the configuration in which the imaging unit is covered with the transflective film and the peripheral region surrounding the imaging unit (optical system) satisfies $L^* \leq 50$ in the CIE-Lab (D50) color space. As described above, the region corresponding to the imaging unit and the peripheral region look the same. Therefore, the presence of the imaging unit can be made to be inconspicuous.

In addition, in the present invention, the transflective film 14 includes at least one of a multi-layer polymer film or a cholesteric liquid crystal layer so as to reflect a part of the incident light and to allow transmission of a part of the remaining light.

The multi-layer polymer film reflects linearly polarized light in one polarization direction and allows transmission of linearly polarized light in another polarization direction. In addition, the cholesteric liquid crystal layer reflects circularly polarized light in one polarization direction and allows transmission of circularly polarized light in another polarization direction.

The multi-layer polymer film and the cholesteric liquid crystal layer will be described below in detail.

As in the related art, in the configuration in which the imaging unit is covered and hidden with the half mirror, the external appearance of the half mirror portion looks like a mirror. Therefore, there is a problem in that it is difficult to apply various designs to the half mirror portion.

On the other hand, the multi-layer polymer film or the cholesteric liquid crystal layer selectively reflects light having a predetermined wavelength and can appropriately adjust a selective reflection wavelength. Therefore, the external appearance of the imaging device can be decorated with a given color such that various designs can be applied thereto.

In addition, in the configuration in which the imaging unit is covered and hidden with the smoke plate as in the related art, light incident into the image pickup element transmits through the smoke plate to be affected by the tint of the smoke plate. Therefore, there is a problem in that the entire obtained image is affected by the tint of the smoke plate. The reason for this is that the smoke plate allows transmission of light in a specific wavelength range and absorbs light in another wavelength range.

On the other hand, the multi-layer polymer film or the cholesteric liquid crystal layer allows transmission of light or reflects light depending on polarization directions. Therefore, transmission of light in at least one polarization direction can be allowed in the entire wavelength range (wide wavelength range). Thus, light in the entire wavelength range can be made to be appropriately incident into the image pickup element, and a clear image can be obtained.

Here, from the viewpoint of making the imaging unit to be inconspicuous, the peripheral region surrounding the imaging unit (optical system) satisfies preferably L*≤20 and more preferably L*≤10 in the CIE-Lab (D50) color space.

In addition, the peripheral region surrounding the imaging unit is not particularly limited as long as it satisfies at least L*≤50. It is preferable that a wider region than the peripheral region satisfies at least L*≤50. Specifically, in a case where an annular region including a circumference of a circumscribed circle of the image pickup element 20 as an inner circumference and including a circumference of a circle concentric with the circumscribed circle as an outer circumference satisfies L*≤50 and the diameter of the outer circumference is represented by $D_2$, it is preferable that $D_2 \leq 2.0 \times D_0$ and it is preferable that $D_2 \geq 2.5 \times D_0$.

Figure 4:
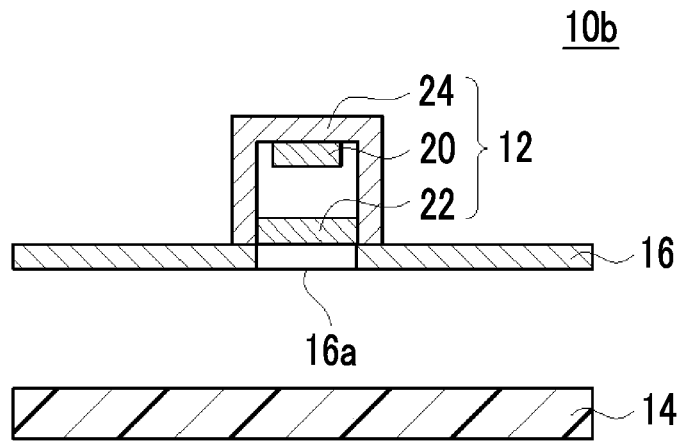
FIG. 4 is a cross-sectional view schematically illustrating another example of the imaging device according to the present invention.
Figure 5:
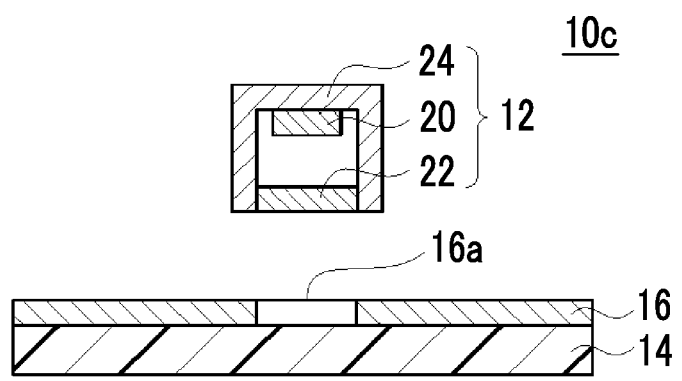
FIG. 5 is a cross-sectional view schematically illustrating still another example of the imaging device according to the present invention.
Figure 6:
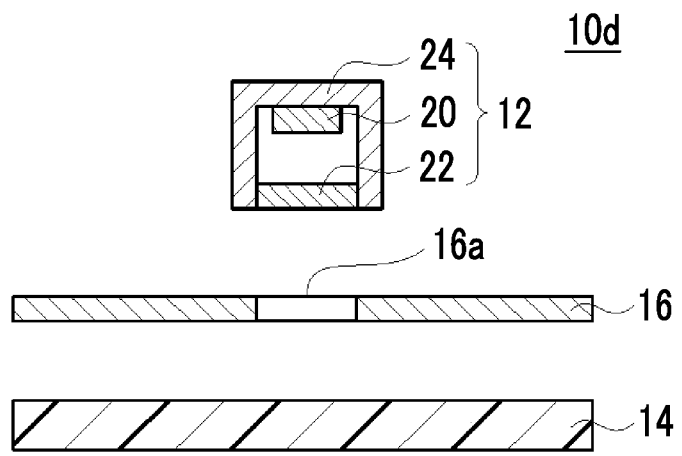
FIG. 6 is a cross-sectional view schematically illustrating still another example of the imaging device according to the present invention.

In addition, in the example illustrated in FIG. 1, the imaging unit 12, the blocking member 16, and the transflective film 14 are disposed to be in contact with each other, but the present invention is not limited thereto. As in an imaging device 10b illustrated in FIG. 4, the imaging unit 12, the blocking member 16, and the transflective film 14 may be disposed such that the imaging unit 12 and the blocking member 16 are in contact with each other and the blocking member 16 and the transflective film 14 are separated from each other. Alternatively, as in an imaging device 10c illustrated in FIG. 5, the imaging unit 12, the blocking member 16, and the transflective film 14 may be disposed such that the imaging unit 12 and the blocking member 16 are separated from each other and the blocking member 16 and the transflective film 14 are in contact with each other. Alternatively, as in an imaging device 10d illustrated in FIG. 6, the imaging unit 12, the blocking member 16, and the transflective film 14 may be disposed so as to be separated from each other.

In a case where members are separated from each other, unnecessary light may be incident through a gap therebetween. Due to this light, the imaging unit is likely to be conspicuous, and the quality of an image obtained by the unnecessary light incident into the image pickup element may deteriorate. From the viewpoint of suppressing these problems, it is preferable that the imaging unit 12 and the blocking member 16 are in contact with each other, and it is preferable that the blocking member 16 and the transflective film 14 are in contact with each other.

Figure 7:
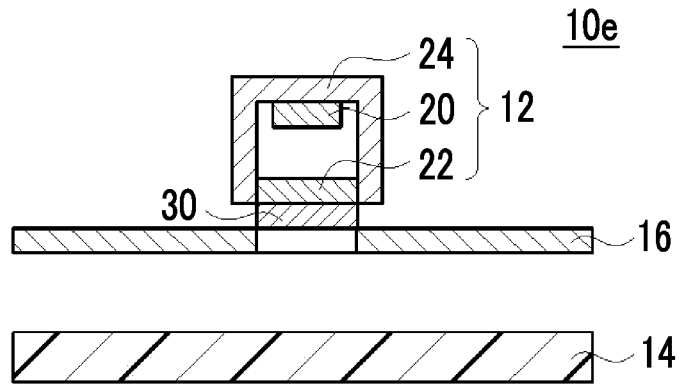
FIG. 7 is a cross-sectional view schematically illustrating still another example of the imaging device according to the present invention.

In addition, as in an imaging device 10e illustrated in FIG. 7, an antireflection layer 30 may be provided on the surface side of the image pickup element 20 where light is incident, that is, on the outermost surface side (transflective film 14 side) of the optical system 22. The imaging device 10e illustrated in FIG. 7 has the same configuration as that of the imaging device 10b illustrated in FIG. 4, except that the antireflection layer 30 is provided. Therefore, the same portions are represented by the same reference numerals, and different points will be mainly described below. This point can also be applied to other examples.

With the configuration in which the antireflection layer 30 is provided on the outermost surface side of the optical system 22, reflection of light incident into the optical system 22 from a lens surface or the like of the optical system 22 can be suppressed, and the imaging unit 12 can be made to be more inconspicuous from the outside.

The antireflection layer 30 is not particularly limited, and a well-known antireflection layer of the related art used in an optical device can be appropriately used.

For example, the following antireflection film can be used as the antireflection layer.

In the antireflection film, in general, an antireflection coating including a low refractive index layer as an antifouling layer and at least one layer having a higher refractive index than the low refractive index layer (that is, a high refractive index layer or an intermediate refractive index layer) as antireflection layers is provided on a transparent substrate. In the present invention, it is preferable that a cellulose acylate film according to the present invention is used as the transparent substrate.

Examples of a method of forming the antireflection coating include: a method of laminating transparent thin films formed of inorganic compounds (metal oxides) having different refractive indices to form a multi-layer film; a method of forming a thin film using a chemical vapor deposition (CVD) method or a physical vapor deposition (PVD) method; and a method of forming a thin film by performing a post-treatment (ultraviolet irradiation: JP1993-157855A (JP-H9-157855A), plasma treatment: JP2002-327310A) after forming a colloidal metal oxide particle film using a sol-gel method of a metal compound such as a metal alkoxide. Further, as a method of forming the antireflection coating with high productivity, various methods such as a method of forming the antireflection coating by applying and laminating a thin film composition that is obtained by dispersing inorganic particles on a matrix have been disclosed. In addition, examples of the antireflection film that is formed by the above-described application include an antireflection film that is formed of an antireflection coating in which the outermost layer surface has a fine uneven shape to impart anti-glare characteristics.

(Layer Configuration of Application Type Antireflection Coating)

In a case where the antireflection coating provided on the transparent substrate include three layers, that is, the antireflection coating has a layer configuration in which an intermediate refractive index layer, a high refractive index layer, and a low refractive index layer (outermost layer) are provided in this order, the antireflection coating is designed so as to have refractive indices satisfying the following relationship.

Refractive Index of High Refractive Index Layer>Refractive Index of Intermediate Refractive Index Layer>Refractive Index of Transparent Substrate>Refractive Index of Low Refractive Index Layer In addition, a hard coat layer may be provided between the transparent substrate and the intermediate refractive index layer. Alternatively, the antireflection film may include an intermediate refractive index hard coat layer, a high refractive index layer, and a low refractive index layer. Examples of this antireflection film are disclosed in, for example, JP1996-122504A (JP-H8-122504A), JP1996-110401A (JP-H8-110401A), JP1998-300902A (JP-H10-300902A), JP2002-243906A, and JP2000-111706A. Further, another function may be imparted to each of the layers, and examples of this antireflection film include an antifouling low refractive index layer and an antistatic high refractive index layer (for example, JP1998-206603A (JP-H10-206603A) and JP2002-243906A).

The haze of the antireflection coating is preferably 5% or lower and more preferably 3% or lower. In addition, the hardness of the surface of the antireflection coating is preferably H or higher, more preferably 2H or higher, and most preferably 3H or higher in a pencil hardness test according to JIS K-5400.

(High Refractive Index Layer and Intermediate Refractive Index Layer)

It is preferable that the layers (the high refractive index layer and the intermediate refractive index layer) having a high refractive index in the antireflection coating of the antireflection film according to the present invention are formed of a curing film including at least inorganic compound particles having a high refractive index and an average particle size of 100 nm or less and a matrix binder.

(Inorganic Compound Particles)

As the inorganic compound particles used for a high refractive index, for example, an inorganic compound having a refractive index of 1.65 or higher can be used, and an inorganic compound having a refractive index of 1.9 or higher is preferable.

Examples of the inorganic compound include an oxide of Ti, Zn, Sb, Sn, Zr, Ce, Ta, La, In, or the like and a composite oxide including the above-described metal atoms. Among these, zirconium dioxide fine particles or inorganic particles (hereinafter, also referred to as "specific oxide") mainly formed of titanium dioxide including at least one element (hereinafter, this element will also be referred to as "additive element") selected from Co, Zr, or Al (preferably Co) are more preferable. The total content of the additive element is preferably 0.05 to 30 mass % and more preferably 0.2 to 7 mass % with respect to Ti.

In addition, examples of other preferable inorganic particles include particles of a composite oxide of at least one metal element (hereinafter, also abbreviated as "Met") selected from metal elements whose oxides have a refractive index of 1.95 or higher and titanium, the composite oxide being inorganic particles (also referred to as "specific composite oxide") doped with at least one metal ion selected from a Co ion, a Zr ion, or an Al ion. Here, as the metal elements whose oxides have a refractive index of 1.95 or higher, Ta, Zr, In, Nd, Sb, Sn, and Bi are preferable. In particular, Ta, Zr, Sn, and Bi are preferable. The content of the metal ion with which the composite oxide is doped is preferably higher than 25 mass % with respect to all the metals (Ti+Met) constituting the composite oxide from the viewpoint of maintaining the refractive index. The content of the metal ion is more preferably 0.1 to 5 mass %.

(Matrix Binder)

Examples of a material for forming the matrix of the high refractive index layer include a thermoplastic resin and a curable resin film that are well-known in the related art. In addition, at least one composition selected from a polyvinyl compound-containing composition including at least two radically polymerizable and/or cationically polymerizable groups, an organic metal compound including a hydrolyzable group, or a partial condensate composition thereof is preferable. Examples include compounds described in JP2000-047004A, JP2001-315242A, JP2001-031871A, and JP2001-296401A. Further, a colloidal metal oxide obtained from a hydrolyzed condensate of a metal alkoxide or a curing film obtained from a metal alkoxide composition is also preferable. These compounds are described in, for example, JP2001-293818A.

The refractive index of the high refractive index layer is generally 1.65 to 2.10. The thickness of the high refractive index layer is preferably 5 nm to 10 μm and more preferably 10 nm to 1 μm. In addition, the refractive index of the intermediate refractive index layer is adjusted to be a value between the refractive index of the low refractive index layer and the refractive index of the high refractive index layer. The refractive index of the intermediate refractive index layer is preferably 1.50 to 1.70. The thickness of the intermediate refractive index layer is preferably 5 nm to 10 μM and more preferably 10 nm to 1 μm.

(Low Refractive Index Layer)

The low refractive index layer is sequentially laminated on the high refractive index layer. The refractive index of the low refractive index layer is preferably in a range of 1.20 to 1.55 and more preferably in a range of 1.27 to 1.47. It is preferable that the low refractive index layer is constructed as an outermost layer having scratch resistance and antifouling properties. As a method of largely improve scratch resistance, a method of imparting lubricating properties to the surface is effective, and a method of forming a thin layer of the related art such as introduction of silicone or introduction of fluorine can be applied.

The refractive index of the fluorine-containing compound is preferably 1.35 to 1.50. The refractive index of the fluorine-containing compound is preferably 1.36 to 1.47. In addition, the fluorine-containing compound is preferably a compound including a crosslinkable or polymerizable functional group and 35 to 80 mass % of fluorine atoms. Examples of the compound include compounds described in paragraphs "0018" to "0026" of JP1997-222503A (JP-H9-222503A), paragraphs "0019" to "0030" of JP1999-038202A (JP-H11-038202A), paragraphs "0027" and "0028" of JP2001-040284A, JP2000-284102A, and JP2004-045462A.

The silicone compound is preferably a compound having a polysiloxane structure in which a polymer chain includes a curable functional group or a polymerizable functional group to form a crosslinked structure in the film. Examples of the silicone compounds include a reactive silicone (for example, "SILAPLANE" manufactured by Chisso Corporation), and a polysiloxane including a silanol group at both terminals (for example, a polysiloxane described JP1999-258403A (JP-H11-258403A)).

It is preferable that a crosslinking or polymerization reaction of a polymer having a crosslinking or polymerizable group and including fluorine and/or siloxane is performed using a method including: applying a coating composition for forming the outermost layer that includes a polymerization initiator, a sensitizer, and the like; and irradiating the applied composition with light or heating the applied composition during or after the application.

In addition, a sol-gel cured film is also preferable that is cured by a condensation reaction of an organic metal compound such as a silane coupling agent and a silane coupling agent having a specific fluorine-containing hydrocarbon group in the coexistence of a catalyst. Examples of the sol-gel cured film include a polyfluoroalkyl group-containing silane compound or a partially hydrolyzed condensate thereof (compounds described in JP1983-142958A (JP-S58-142958A), JP1983-147483A (JP-S58-147483A), JP1983-147484A (JP-S58-147484A), JP1997-157582A (JP-H9-157582A), JP1999-106704A (JP-H11-106704A)) and a silyl compound including a polyperfluoroalkyl ether group as a fluorine-containing long-chain group (compounds described in JP2000-117902A, JP2001-048590A, and JP2002-053804A).

It is preferable that the low refractive index layer includes, as additives other than the above-described additives, a filler (for example, silicon dioxide (silica)) or a low refractive index inorganic compound having an average primary particle size of 1 to 150 nm such as fluorine-containing particles (for example, magnesium fluoride, calcium fluoride, or barium fluoride).

In particular, in order to further reduce an increase in refractive index, it is preferable that the low refractive index layer includes hollow inorganic particles. The refractive index of the hollow inorganic particles is typically 1.17 to 1.40 and preferably 1.17 to 1.37. The refractive index described herein represents the refractive index of the particles as a whole and does not represent the refractive index of only shells that form the hollow inorganic particles. The refractive index of the hollow inorganic particles is preferably 1.17 or higher from the viewpoints of the strength of the particles and the scratch resistance of the low refractive index layer including the hollow particles.

The refractive index of the hollow inorganic particles can be measured using an Abbe refractometer (manufactured by Atago Co., Ltd.).

In a case where the radius of a void in a hollow inorganic particle is represented by ri and the radius of a particle shell is represented by ro, the void volume of the hollow inorganic particle is calculated according to the following Expression (12).

$$w=(ri/ro)^3 \times 100 \qquad \text{Expression (12)}$$

From the viewpoints of the strength of the particles and the scratch resistance of the antireflection coating surface, the void volume of the hollow inorganic particles is preferably 10% to 60% and more preferably 20% to 60%.

The average particle size of the hollow inorganic particles in the low refractive index layer is 30% to 100% and preferably 35% to 80% with respect to the thickness of the low refractive index layer. That is, in a case where the thickness of the low refractive index layer is 100 nm, the particle size of the inorganic particles is in a range of 30 to 100 nm and preferably in a range of 35 to 80 nm. In a case where the average particle size is in the above-described range, the strength of the antireflection coating is sufficiently exhibited.

Examples of other additives included in the low refractive index layer include organic particles and the like described in paragraphs "0020" to "0038" of JP1999-003820A (JP-H11-003820A), a silane coupling agent, a lubricant, and a surfactant.

In a case where the outermost layer is further formed on the low refractive index layer, the low refractive index layer may be formed using a vapor phase method (for example, a vacuum deposition method, a sputtering method, an ion plating method, or a plasma CVD method) but is preferably formed using a coating method from the viewpoint that the layer can be formed at a low cost. The thickness of the low refractive index layer is preferably 30 to 200 nm, more preferably 50 to 150 nm, and most preferably 60 to 120 nm.

(Other Layers of Antireflection Film)

For example, a hard coat layer, a forward scattering layer, a primer layer, an antistatic layer, an undercoat layer, or a protective layer may be further formed in the antireflection film (or the antireflection coating provided on a polarizing plate protective film).

(Hard Coat Layer)

The hard coat layer is provided on a surface of the transparent substrate in order to impart a physical strength to the antireflection film. In particular, it is preferable that the hard coat layer is provided between the transparent substrate and the high refractive index layer (that is, the intermediate refractive index hard coat layer that functions as the intermediate refractive index layer and the hard coat layer is provided).

It is preferable that the hard coat layer is formed in a crosslinking reaction or a polymerization reaction of a curable compound that is curable by light and/or heat. As the curable functional group, a photopolymerizable functional group is preferable. As an organic metal compound including a hydrolyzable functional group, an organic alkoxysilyl compound is preferable. Specific examples of these compounds are the same as those described above regarding the high refractive index layer. Specific examples of a composition for forming the hard coat layer include compositions described in JP2002-144913A, JP2000-009908A, and WO2000/046617A.

The high refractive index layer may also function as the hard coat layer. In this case, it is preferable that particles are finely dispersed in the hard coat layer to be added thereto using the method described above regarding the high refractive index layer. The hard coat layer may also function as an anti-glare layer (described below) having an antiglare function by including particles having an average particle size of 0.2 to 10 μm.

The thickness of the hard coat layer can be appropriately set according to the use thereof. The thickness of the hard coat layer is preferably 0.2 to 10 μm and more preferably 0.5 to 7 μm.

In addition, the hardness of the hard coat layer is preferably H or higher, more preferably 2H or higher, and most preferably 3H or higher in a pencil hardness test according to JIS K-5400. In addition, in a taper test according to JIS K-5400, as the wear amount of a specimen in which the hard coat layer is provided before and the test decreases, the scratch resistance of the hard coat layer is evaluated to be higher.

(Forward Scattering Layer)

In a case where a polarizing plate including the antireflection film as a protective film is applied to a liquid crystal display device and the viewing angle is inclined in an upper, lower, left, or right direction, the forward scattering layer is provided to impart a viewing angle improving effect. By dispersing particles having different refractive indices in the hard coat layer, a hard coat function can also be imparted. The details of the forward scattering layer can be found in, for example, JP1999-038208A (JP-H11-038208A) in which a forward scattering coefficient is specified, JP2000-199809A in which a relative refractive index of a transparent resin and particles is adjusted to be in a specific range, and JP2002-107512A in which the haze value is adjusted to be 40% or higher.

(Antiglare Function)

The antireflection film may have an antiglare function of scattering external light. The antiglare function may be obtained by forming unevenness on a surface of the antireflection film, that is, on a surface of the antireflection coating. In a case where the antireflection film has an antiglare function, the haze of the antireflection film is preferably 3% to 50%, more preferably 5% to 30%, and most preferably 5% to 20%.

As a method of forming unevenness on the antireflection coating surface, any method can also be applied as long as it is a method capable of sufficiently retaining the surface shape. Examples of the method include: a method in which unevenness is formed on a film surface using particles in the low refractive index layer (for example, JP2000-271878A); a method in which a small amount (0.1 to 50 mass %) of relatively coarse particles (particle size of 0.05 to 2 μm is added to a layer (the high refractive index layer, the intermediate refractive index layer, or the hard coat layer) below the low refractive index layer to form a surface unevenness film and the low refractive index layer that retains the shapes of the layers is provided on the surface unevenness film (for example, JP2000-281410A, JP2000-095893A, JP2001-100004A, or JP2001-281407A); and a method in which a top layer (antifouling layer) is provided and an unevenness shape is physically transferred to a surface of the top layer (for example, as an embossing method, JP1988-278839A (JP-S63-278839A), JP1999-183710A (JP-H11-183710A), or JP2000-275401A).

In addition, as the antireflection layer, a λ/4 plate and a linear polarizing plate may be provided from the transflective film 14 side.

The λ/4 plate and the linear polarizing plate will be described below.

Figure 8:
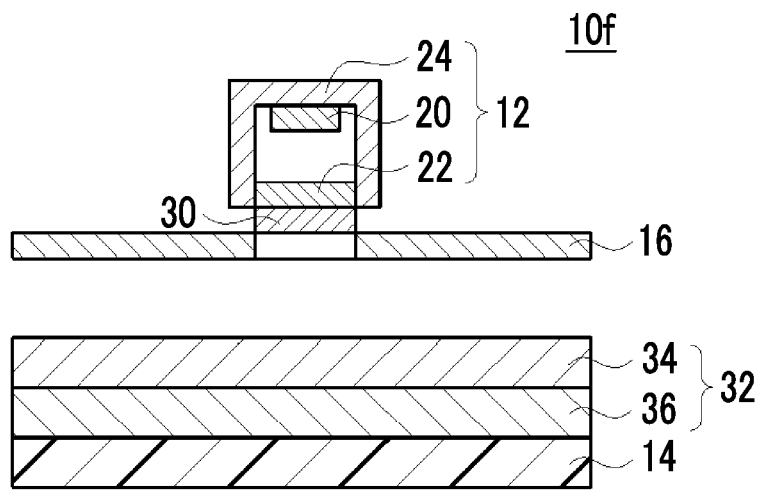
FIG. 8 is a cross-sectional view schematically illustrating still another example of the imaging device according to the present invention.

In addition, in a case where the transflective film 14 includes a cholesteric liquid crystal layer, as in an imaging device 10f illustrated in FIG. 8, a circularly polarizing plate 32 may be disposed between the blocking member 16 and the transflective film 14. In the example illustrated in FIG. 8, as the circularly polarizing plate 32, a laminate including a λ/4 plate 36 and a linear polarizing plate 34 provided. The circularly polarizing plate 32 including the combination of the λ/4 plate 36 and the linear polarizing plate 34 allows transmission of circularly polarized light in a turning direction opposite to a turning direction of circularly polarized light reflected from the cholesteric liquid crystal layer.

As described above, the cholesteric liquid crystal layer reflects one circularly polarized light and allows transmission of another circularly polarized light. Therefore, the other circularly polarized light transmitted through the cholesteric liquid crystal layer is incident into the λ/4 plate 36. Here, the λ/4 plate 36 is disposed to align a slow axis such that the incident circularly polarized light is converted into linearly polarized light. Therefore, the circularly polarized light incident into the λ/4 plate 36 is converted into linearly polarized light. This linearly polarized light is incident into the linear polarizing plate 34. Here, the linear polarizing plate 34 is disposed to align a polarizing axis such that the incident linearly polarized light transmitted through the λ/4 plate 36 transmits through the linear polarizing plate 34. Accordingly, the linearly polarized light incident into the linear polarizing plate 34 transmits through the linear polarizing plate 34 and is incident into the optical system 22 and the blocking member 16.

Here, the cholesteric liquid crystal layer reflects light having a predetermined selective reflection wavelength. Accordingly, light having a wavelength other than the selective reflection wavelength transmits through the cholesteric liquid crystal layer irrespective of the turning direction. Therefore, in a case where the light transmitted through the cholesteric liquid crystal layer is directly incident into the imaging unit 12 (optical system 22), only the light amount of the light having the selective reflection wavelength is reduced by half, and the light amount of light in another wavelength range does not substantially change. Therefore, a balance between colors in an image obtained by the imaging unit 12 may collapse.

On the other hand, by disposing the circularly polarizing plate 32 between the blocking member 16 and the transflective film 14, in light (unpolarized light) having a wavelength other than the selective reflection wavelength transmitted through the transflective film 14, transmission of only light in one polarization direction is allowed and light in another polarization direction is blocked. Therefore, in the light incident into the imaging unit 12, not only the light amount of the light having the selective reflection wavelength but also the light amount of the light in another wavelength range are reduced by half of the light amount of the light incident into the imaging device, and the collapse of a balance between colors in an image obtained by the imaging unit 12 can be suppressed.

Figure 9:
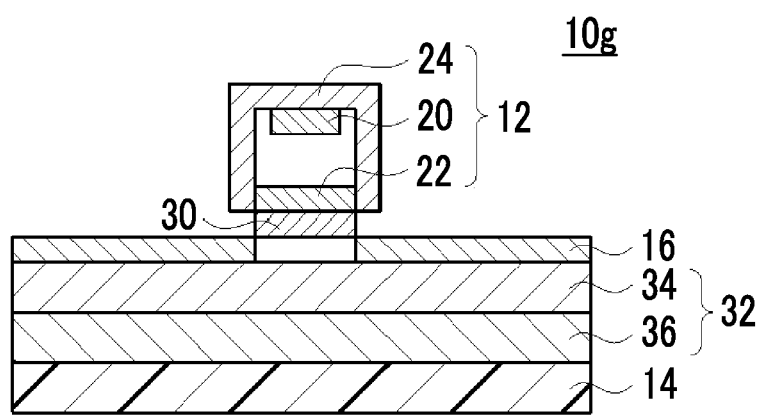
FIG. 9 is a cross-sectional view schematically illustrating still another example of the imaging device according to the present invention.

In the example illustrated in FIG. 8, the blocking member 16 and the circularly polarizing plate 32 (the linear polarizing plate 34) are disposed to be separated from each other. However, it is preferable that the blocking member 16 is in contact with a layer on the transflective film 14 side. For example, as in an imaging device 10g illustrated in FIG. 9, it is preferable that the blocking member 16 and the circularly polarizing plate 32 are disposed to be in contact with each other. By disposing the blocking member 16 to be in contact with the layer on the transflective film 14 side, the visibility of a color or a picture of the transflective film 14 is improved, which is preferable from the viewpoint that the imaging unit 12 on the rear side becomes inconspicuous.

Figure 10:
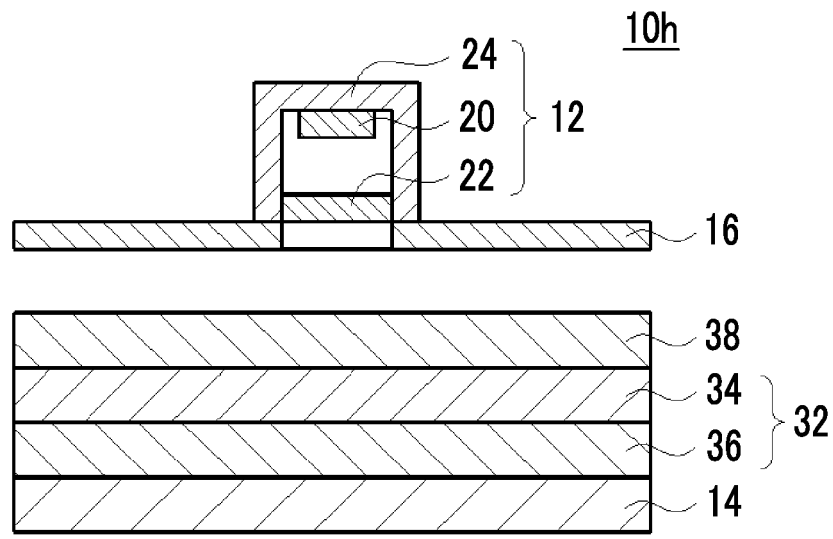
FIG. 10 is a cross-sectional view schematically illustrating still another example of the imaging device according to the present invention.

In addition, as in an imaging device 10h illustrated in FIG. 10, a second λ/4 plate 38 may be further disposed between the circularly polarizing plate 32, which includes the λ/4 plate 36 and the linear polarizing plate 34, and the blocking member 16. As a result, the above-described antireflection effect can be imparted using a combination of the linear polarizing plate 34 of the circularly polarizing plate 32 and the second λ/4 plate 38.

It is necessary that the combination of the linear polarizing plate 34 and the second λ/4 plate 38 is disposed to align an optic axis such that the circularly polarizing plate allows transmission of circularly polarized light in a turning direction opposite to a turning direction of circularly polarized light reflected from the cholesteric liquid crystal layer.

In a case where circularly polarized light transmitted through the cholesteric liquid crystal layer is reflected, a turning direction of the reflected circularly polarized light is reversed. Therefore, by disposing the combination (circularly polarizing plate) of the linear polarizing plate 34 and the second λ/4 plate 38 between the imaging unit 12 and the blocking member 16 and the cholesteric liquid crystal layer, the reflected light (circularly polarized light) of which the turning direction is reversed can be absorbed. Thus, emission of the reflected light to the outside of the imaging device can be suppressed, and the presence of the imaging unit can be made to be inconspicuous.

In the example illustrated in FIG. 10, the second λ/4 plate 38 is disposed between the linear polarizing plate 34 and the blocking member 16, but the present invention is not limited thereto. For example, the second λ/4 plate 38 may be disposed between the blocking member 16 and the imaging unit 12. In this configuration, in the region of the opening 16a of the blocking member 16, the combination of the linear polarizing plate 34 and the second λ/4 plate 38 functions as the circularly polarizing plate. Accordingly, reflected light from the imaging unit 12 can be suppressed.

In addition, in a case where the cholesteric liquid crystal layer is used as the transflective film, as in the example illustrated in FIG. 1 or the like, a uniform layer that reflects light having one selective reflection wavelength is formed. However, the present invention is not limited to the example. The cholesteric liquid crystal layer may have two or more reflecting regions having different selective reflection wavelengths.

Figure 11:
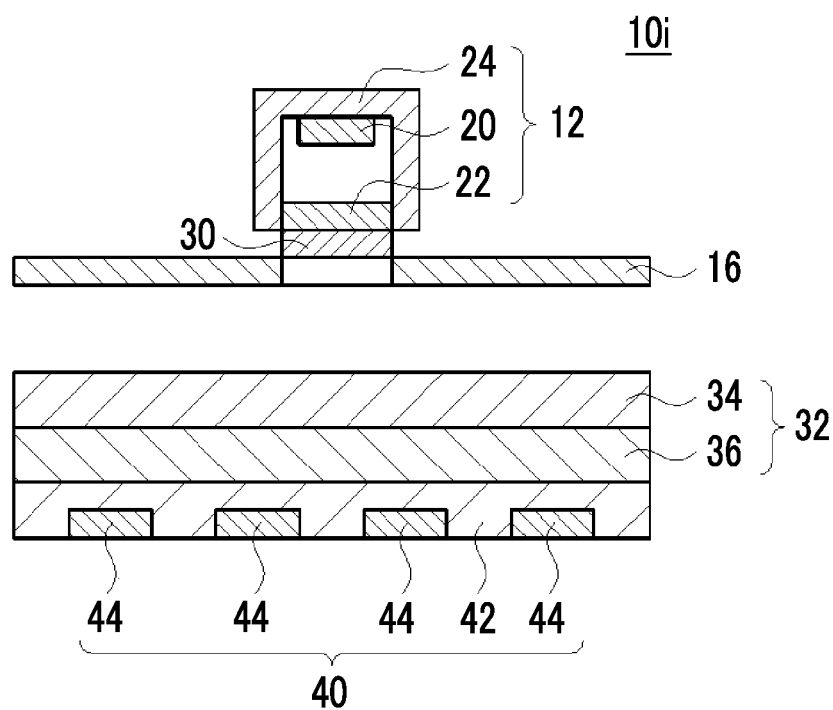
FIG. 11 is a cross-sectional view schematically illustrating still another example of the imaging device according to the present invention.
Figure 12:
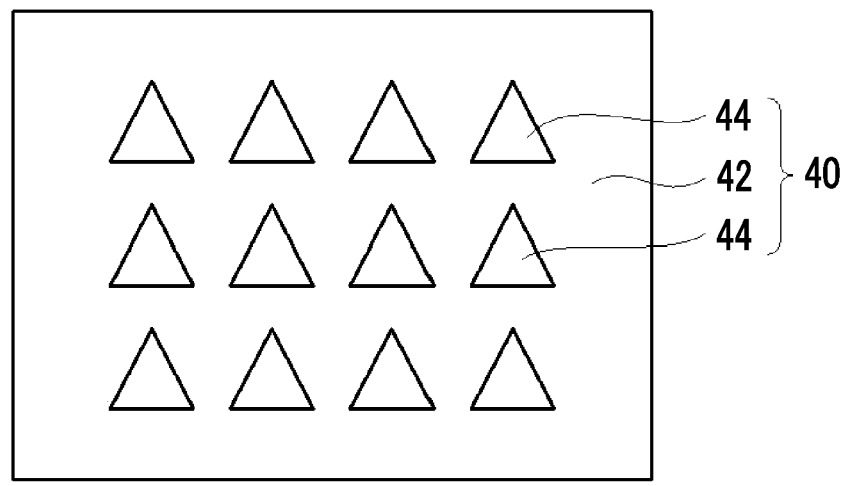
FIG. 12 is a front view of FIG. 11.

FIG. 11 is a cross-sectional view schematically illustrating still another example of the imaging device according to the embodiment of the present invention. FIG. 12 is a front view of FIG. 11 when seen from the transflective film side. An imaging device 10i illustrated in FIGS. 11 and 12 has the same configuration as that of the imaging device 10f illustrated in FIG. 8, except that a transflective film 40 is provided instead of the transflective film 14. Therefore, the same portions are represented by the same reference numerals, and different portions will be mainly described below.

The transflective film 40 of the imaging device 10i illustrated in FIGS. 11 and 12 includes two reflecting regions including a first reflecting region 42 and a second reflecting region 44. As illustrated in FIG. 12, the second reflecting region 44 is a region having a triangular shape in a plan view, and a plurality of second reflecting regions 44 are arranged in a predetermined pattern. In addition, the first reflecting region 42 is a region surrounding the second reflecting region 44.

A selective reflection wavelength in the first reflecting region and a selective reflection wavelength in the second reflecting region are different from each other. For example, in a configuration in which the first reflecting region reflects red right circularly polarized light and the second reflecting region reflects green right circularly polarized light, when seen from the transflective film 40 side, a pattern in which a plurality of green triangles are arranged is observed in the red background color.

On the other hand, in the imaging unit 12 (optical system 22), left circularly polarized light having a selective reflection wavelength and light having a wavelength other than the selective reflection wavelength transmits through the transflective film 40 and is incident thereinto. Accordingly, light in the entire wavelength range can be made to be appropriately incident into the image pickup element 20, and a clear image can be obtained irrespective of the formation pattern of the reflecting regions.

This way, with the configuration in which the cholesteric liquid crystal layer includes two or more reflecting regions having different selective reflection wavelength, various designs can be applied to the external appearance of the imaging device. In addition, since the pattern corresponding to the formation pattern of the reflecting regions is observed, the imaging unit becomes more inconspicuous. In addition, a clear image can be obtained irrespective of the design (the formation pattern of the reflecting regions). In particular, as in the example illustrated in FIG. 11, with the configuration in which the circularly polarizing plate 32 is disposed between the transflective film 40 and the blocking member 16, the collapse of a balance between colors in an image obtained by the imaging unit 12 can be suppressed. That is, the formation pattern of the reflecting regions can be suppressed from being observed in the obtained image.

In addition, in a case where the cholesteric liquid crystal layer is used as the transflective film, as in the example illustrated in FIG. 1 or the like, one cholesteric liquid crystal layer is provided, but the present invention is not limited thereto. Two or more cholesteric liquid crystal layers having different selective reflection wavelengths may be provided.

Figure 16:
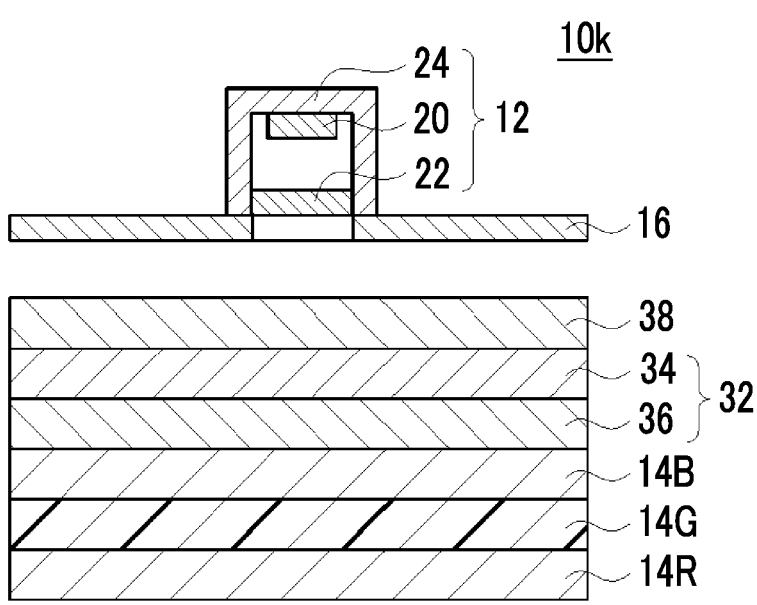
FIG. 16 is a cross-sectional view schematically illustrating still another example of the imaging device according to the present invention.

FIG. 16 is a cross-sectional view schematically illustrating still another example of the imaging device according to the embodiment of the present invention. An imaging device 10k illustrated in FIG. 16 has the same configuration as that of the imaging device 10h illustrated in FIG. 10, except that three cholesteric liquid crystal layers are provided. Therefore, the same portions are represented by the same reference numerals, and different portions will be mainly described below.

The imaging device 10k illustrated in FIG. 16 includes, as the transflective film, three cholesteric liquid crystal layers including a cholesteric liquid crystal layer 14B that reflects blue light, a cholesteric liquid crystal layer 14G that reflects green light, and a cholesteric liquid crystal layer 14R that reflects red light. That is, the three cholesteric liquid crystal layers have different selective reflection wavelengths.

This way, with the configuration in which two or more cholesteric liquid crystal layers having different selective reflection wavelengths are provided as the transflective film, the external appearance of the imaging device can be made to have a color such as white other than the selective reflection wavelengths using reflected light from the respective cholesteric liquid crystal layers.

In the example illustrated in FIG. 16, the cholesteric liquid crystal layer 14B that reflects blue light, the cholesteric liquid crystal layer 14G that reflects green light, and the cholesteric liquid crystal layer 14R that reflects red light are laminated in this order from the blocking member 16 side, but the laminating order is not limited thereto.

In addition, even in a case where two or more cholesteric liquid crystal layers are laminated, each of the cholesteric liquid crystal layers includes two or more reflecting regions having different selective reflection wavelengths. As a result, various designs can be applied to the external appearance of the imaging device.

In addition, the imaging device according to the embodiment of the present invention may include a reflection uniformizing layer that is disposed between the blocking member 16 and the transflective film 14.

Figure 17:
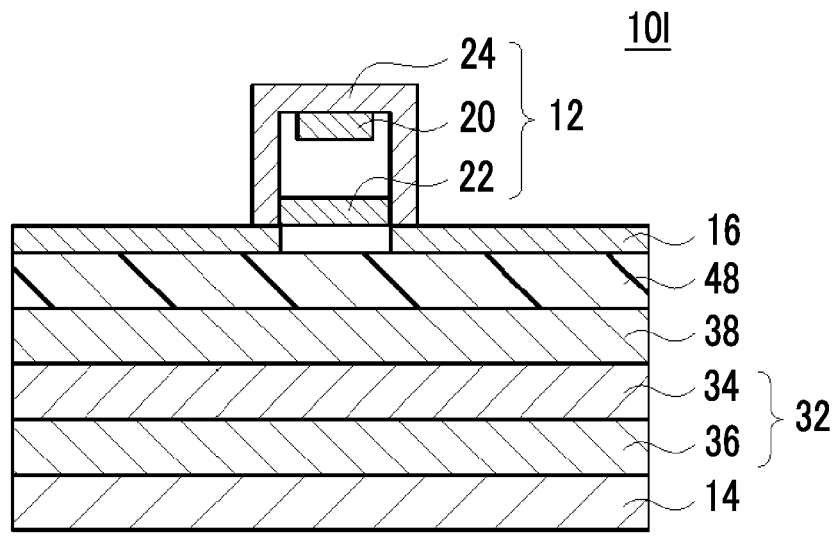
FIG. 17 is a cross-sectional view schematically illustrating still another example of the imaging device according to the present invention.

FIG. 17 is a cross-sectional view schematically illustrating still another example of the imaging device according to the embodiment of the present invention. An imaging device 10l illustrated in FIG. 17 has the same configuration as that of the imaging device 10h illustrated in FIG. 10, except that the reflection uniformizing layer is provided. Therefore, the same portions are represented by the same reference numerals, and different portions will be mainly described below.

The reflection uniformizing layer 48 is disposed between the blocking member 16 and the second λ/4 plate 38. The reflection uniformizing layer 48 is provided to make a reflectivity in the region of the imaging unit 12 and a reflectivity in the region of the blocking member 16 surrounding the imaging unit 12 uniform. For example, by providing a triacetyl cellulose (TAC) film, a polyethylene terephthalate (PET) film, or an acrylic resin film on the blocking member 16 as the reflection uniformizing layer, a reflectivity in the region of the imaging unit 12 and a reflectivity in the region of the blocking member 16 surrounding the imaging unit 12 can be made to be uniform.

As a result, the amount of reflected light in the region of the imaging unit 12 and the amount of reflected light in the region surrounding the imaging unit 12 can be made to be uniform, and the imaging unit 12 can be made to be more inconspicuous.

In a case where the imaging device includes another layer such as the linear polarizing plate 34 between the blocking member 16 and the transflective film 14, it is preferable that the reflection uniformizing layer is provided on a side close to the blocking member.

Figure 18:
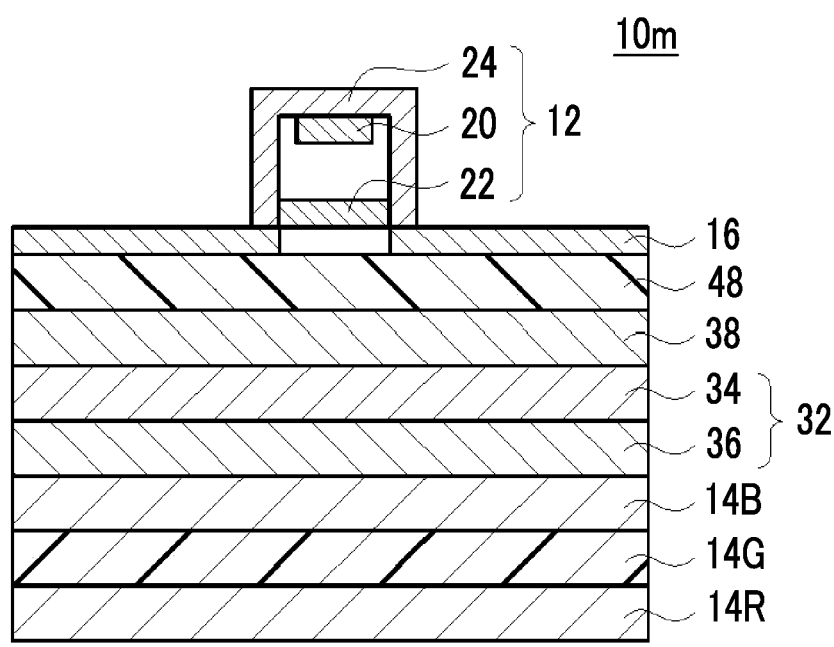
FIG. 18 is a cross-sectional view schematically illustrating still another example of the imaging device according to the present invention.

In addition, as in an imaging device 10m illustrated in FIG. 18, the imaging device may include the reflection uniformizing layer 48 and may further include three cholesteric liquid crystal layers including the cholesteric liquid crystal layer 14B that reflects blue light, the cholesteric liquid crystal layer 14G that reflects green light, and the cholesteric liquid crystal layer 14R that reflects red light.

In addition, in the configuration of the imaging device according to the embodiment of the present invention in which the blocking member 16 is disposed between the imaging unit 12 and the transflective film 14, a laminate including the transflective film 14 and the blocking member 16 may be prepared and this laminate may be used in combination with a device including the imaging unit 12.

For example, a cover of a smartphone (a so-called smartphone cover) may include a laminate including the transflective film 14 and the blocking member 16, and this smartphone cover may be used in combination with a smartphone to configure the imaging device according to the embodiment of the present invention.

This laminate is the laminate according to the present invention. In addition to the transflective film 14 and the blocking member 16, the laminate may include the antireflection layer, the circularly polarizing plate, the linear polarizing plate, the λ/4 plate, and the like.

In addition, in the example illustrated in FIG. 1 or the like, the blocking member is disposed between the imaging unit and the transflective film, but the present invention is not limited thereto.

Figure 13:
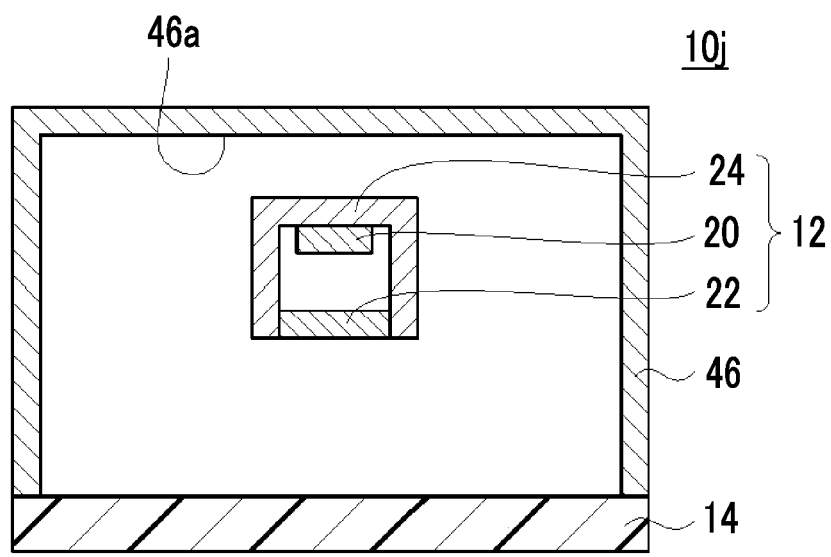
FIG. 13 is a cross-sectional view schematically illustrating still another example of the imaging device according to the present invention.

FIG. 13 is a schematic cross-sectional view illustrating still another example of the imaging device according to the embodiment of the present invention.

An imaging device 10*j* illustrated in FIG. 13 includes the imaging unit 12, the transflective film 14, and a box-shaped member 46.

The box-shaped member 46 has a shape of a substantially rectangular box with one open surface.

In the box-shaped member 46, the imaging unit 12 is disposed such that the optical system 22 side faces the open surface of the box-shaped member 46. Accordingly, a surface of the imaging unit 12 opposite to the surface where light is incident into the image pickup element 20 and a side surface of the imaging unit 12 are covered with the box-shaped member 46.

In addition, the transflective film 14 is disposed on the open surface of the box-shaped member 46.

Here, in the present invention, when seen from the optical axis direction of the optical system 22, a region of the box-shaped member 46 corresponding to the peripheral region satisfies L*≤50 in the CIE-Lab (D50) color space. Specifically, a region surrounding the imaging unit 12 on a bottom surface 46*a* inside the box-shaped member 46 satisfies L*≤50.

Even in this configuration, in a case where the imaging device is seen from the transflective film side, a region corresponding to the imaging unit and a peripheral region surrounding the region look the same when observed with only reflected light from the transflective film. Therefore, the presence of the imaging unit becomes inconspicuous.

From the viewpoint of making the imaging unit inconspicuous, it is preferable that the entire bottom surface of the box-shaped member satisfies L*≤50, and it is more preferable that all the surfaces inside the box-shaped member satisfy L*≤50.

In addition, a region of the box-shaped member corresponding to the peripheral region satisfies preferably L*≤20 and more preferably L*≤10 in the CIE-Lab (D50) color space.

(Cholesteric Liquid Crystal Layer)

Next, the cholesteric liquid crystal layer used as the transflective film will be described.

The cholesteric liquid crystal layer includes a cholesteric liquid crystalline phase and has wavelength selective reflecting properties with respect to circularly polarized light in a specific wavelength range in a predetermined turning direction.

A selective reflection wavelength λ of the selective reflection of the cholesteric liquid crystalline phase depends on a pitch P (=helical cycle) of a helical structure in the cholesteric liquid crystalline phase and complies with an average refractive index n of the cholesteric liquid crystalline phase and a relationship of λ=n×P. Therefore, the selective reflection wavelength can be adjusted by adjusting the pitch of the helical structure. The pitch of the cholesteric liquid crystalline phase depends on the kind of a chiral agent which is used in combination of a polymerizable liquid crystal compound, or the concentration of the chiral agent added. Therefore, a desired pitch can be obtained by adjusting the kind and concentration of the chiral agent.

In addition, a half-width Δλ (nm) of a selective reflection range (circularly polarized light reflection range) where selective reflection is exhibited depends on a refractive index anisotropy Δn of the cholesteric liquid crystalline phase and the helical pitch P and complies with a relationship of Δλ=Δn×P. Therefore, the width of the selective reflection range can be controlled by adjusting Δn. Δn can be adjusted by adjusting a kind of a liquid crystal compound for forming the cholesteric liquid crystal layer and a mixing ratio thereof, and a temperature during alignment. It is known that a reflectivity in the cholesteric liquid crystalline phase depends on Δn. In a case where the same reflectivity is obtained, as Δn increases, the number of helical pitches decreases, that is, the thickness can be reduced.

As a method of measuring a helical sense and a helical pitch, a method described in "Introduction to Experimental Liquid Crystal Chemistry", (the Japanese Liquid Crystal Society, 2007, Sigma Publishing Co., Ltd.), p. 46, and "Liquid Crystal Handbook" (the Editing Committee of Liquid Crystal Handbook, Maruzen Publishing Co., Ltd.), p. 196 can be used.

Reflected light of the cholesteric liquid crystalline phase is circularly polarized light. Whether or not the reflected light is right circularly polarized light or left circularly polarized light is determined depending on a helical twisting direction of the cholesteric liquid crystalline phase. Regarding the selective reflection of the circularly polarized light by the cholesteric liquid crystalline phase, in a case where the helical twisting direction of the cholesteric liquid crystalline phase is right, right circularly polarized light is reflected, and in a case where the helical twisting direction of the cholesteric liquid crystalline phase is left, left circularly polarized light is reflected.

A direction of rotation of the cholesteric liquid crystalline phase can be adjusted by adjusting a kind of a liquid crystal compound for forming the reflecting regions and a kind of a chiral agent to be added.

The cholesteric liquid crystal layer may be configured with a single layer or multiple layers.

A wavelength range of light to be reflected can be widened by sequentially laminating layers in which the selective reflection wavelength λ is shifted. In addition, as a method of changing a helical pitch in a layer stepwise that is called a pitch gradient method, a technique of widening a wavelength range is also known, and specific examples thereof include methods described in Nature 378, 467-469 (1995), JP1994-281814A (JP-H6-281814A), and JP4990426B.

In the present invention, the selective reflection wavelength of the cholesteric liquid crystal layer can be set to be in any one of a visible range (about 380 to 780 nm) or a near infrared range (about 780 to 2000 nm), and a setting method thereof is as described above.

In addition, in a case where the cholesteric liquid crystal layer includes two or more reflecting regions having different selective reflection wavelengths as in the transflective film 40 of the imaging device 10*i* illustrated in FIG. 11, the respective reflecting regions are the above-described cholesteric liquid crystal layers including the cholesteric liquid crystalline phase and have the same configuration as the cholesteric liquid crystal layer, except that they have wavelength selective reflecting properties with respect to circularly polarized light having different wavelength ranges, respectively.

In addition, the selective reflection wavelength of the cholesteric liquid crystal layer (reflecting region) may be, for example, a selective reflection wavelength of red light (light in a wavelength range of 620 nm to 750 nm), a selective reflection wavelength of green light (light in a wavelength range of 495 nm to 570 nm), a selective reflection wavelength of blue light (light in a wavelength range of 420 nm to 490 nm), or another selective reflection wavelength.

Alternatively, the cholesteric liquid crystal layer may include a reflecting region having a wavelength range of infrared light as a selective reflection wavelength. Infrared light refers to light in a wavelength range of longer than 780 nm and 1 mm or shorter. In particular, a near infrared range refers to light in a wavelength range of longer than 780 nm and 2000 nm or shorter.

In addition, the cholesteric liquid crystal layer may include a reflecting region having an ultraviolet range as a selective reflection wavelength. The ultraviolet range refers to a wavelength range of 10 nm or longer and shorter than 380 nm.

In addition, it is preferable that the cholesteric liquid crystal layer is a layer obtained by immobilizing a cholesteric liquid crystalline phase, but the present invention is not limited thereto. In a case where a static image is displayed, it is preferable that a cholesteric liquid crystalline phase is immobilized. In a case where a moving image is displayed, it is preferable that a cholesteric liquid crystalline phase is not immobilized.

Examples of a material used for forming the cholesteric liquid crystal layer include a liquid crystal composition including a liquid crystal compound. It is preferable that the liquid crystal compound is a polymerizable liquid crystal compound.

The liquid crystal composition including a polymerizable liquid crystal compound may further include, for example, a surfactant, a chiral agent, or a polymerization initiator.

——Polymerizable Liquid Crystal Compound——

The polymerizable liquid crystal compound may be a rod-shaped liquid crystal compound or a disk-shaped liquid crystal compound and is preferably a rod-shaped liquid crystal compound.

Examples of the rod-shaped polymerizable liquid crystal compound for forming a cholesteric liquid crystal layer include a rod-shaped nematic liquid crystal compound. As the rod-shaped nematic liquid crystal compound, an azomethine compound, an azoxy compound, a cyanobiphenyl compound, a cyanophenyl ester compound, a benzoate compound, a phenyl cyclohexanecarboxylate compound, a cyanophenylcyclohexane compound, a cyano-substituted phenylpyrimidine compound, an alkoxy-substituted phenylpyrimidine compound, a phenyldioxane compound, a tolan compound, or an alkenylcyclohexylbenzonitrile compound is preferably used. Not only a low-molecular-weight liquid crystal compound but also a high-molecular-weight liquid crystal compound can be used.

The polymerizable liquid crystal compound can be obtained by introducing a polymerizable group into the liquid crystal compound. Examples of the polymerizable group include an unsaturated polymerizable group, an epoxy group, and an aziridinyl group. Among these, an unsaturated polymerizable group is preferable, and an ethylenically unsaturated polymerizable group is more preferable. The polymerizable group can be introduced into the molecules of the liquid crystal compound using various methods. The number of polymerizable groups in the polymerizable liquid crystal compound is preferably 1 to 6 and more preferably 1 to 3. Examples of the polymerizable liquid crystal compound include compounds described in Makromol. Chem. (1989), Vol. 190, p. 2255, Advanced Materials (1993), Vol. 5, p. 107, U.S. Pat. Nos. 4,683,327A, 5,622,648A, 5,770,107A, WO95/22586, WO95/24455, WO97/00600, WO98/23580, WO98/52905, JP1989-272551A (JP-H1-272551A), JP1994-16616A (JP-H6-16616A), JP1995-110469A (JP-H7-110469A), JP1999-80081A (JP-H11-80081A), and JP2001-328973A. Two or more polymerizable liquid crystal compounds may be used in combination. In a case where two or more polymerizable liquid crystal compounds are used in combination, the alignment temperature can be decreased.

Specific examples of the polymerizable liquid crystal compound include compounds represented by the following Formulae (1) to (11).

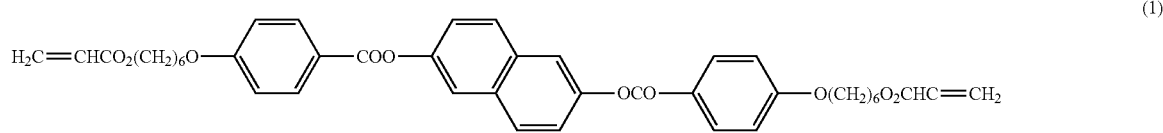

(1)

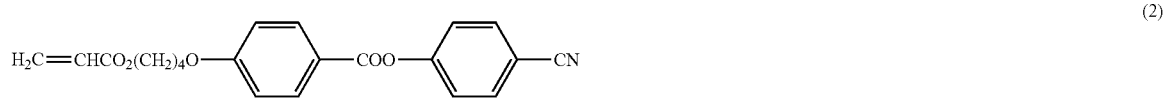

(2)

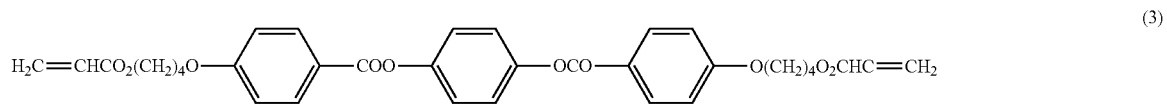

(3)

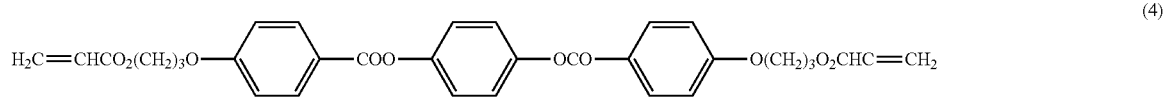

(4)

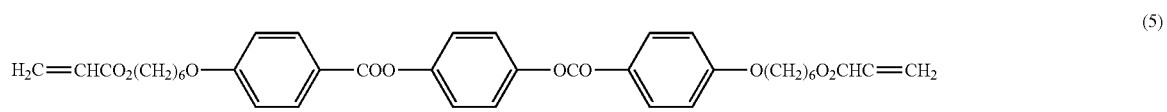

(5)

(6)
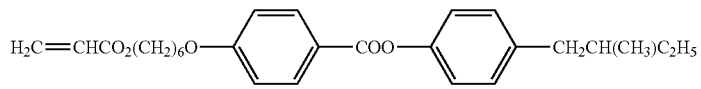

(7)
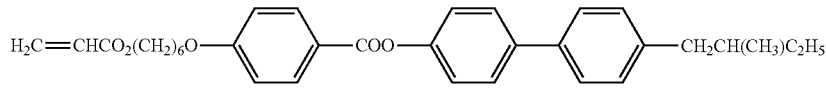

(8)
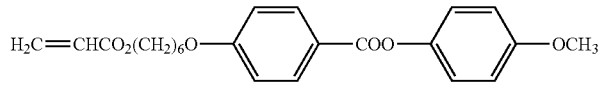

(9)
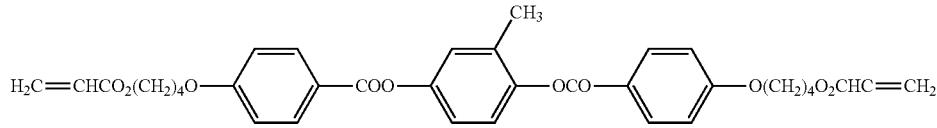

(10)
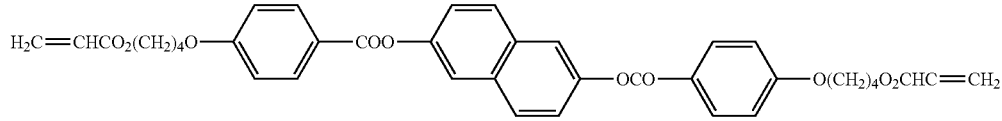

(11)
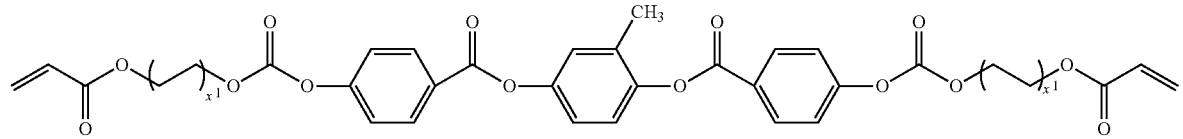

[In Compound (11), $X^1$ Represents 2 to 5 (Integer).]

In addition, as a polymerizable liquid crystal compound other than the above-described examples, for example, a cyclic organopolysiloxane compound having a cholesteric phase described in JP1982-165480A (JP-S57-165480A) can be used. Further, as the above-described high-molecular-weight liquid crystal compound, for example, a polymer in which a liquid crystal mesogenic group is introduced into a main chain, a side chain, or both a main chain and a side chain, a polymer cholesteric liquid crystal in which a cholesteryl group is introduced into a side chain, a liquid crystal polymer described in JP1997-133810A (JP-H9-133810A), and a liquid crystal polymer described in JP1999-293252A (JP-H11-293252A) can be used.

In addition, the addition amount of the polymerizable liquid crystal compound in the liquid crystal composition is preferably 75 to 99.9 mass %, more preferably 80 to 99 mass %, and still more preferably 85 to 90 mass % with respect to the solid content mass (mass excluding a solvent) of the liquid crystal composition.

——Chiral Agent (Optically Active Compound)——

The chiral agent has a function of causing a helical structure of a cholesteric liquid crystalline phase to be formed. The chiral compound may be selected depending on the purpose because a helical twisting direction or a helical pitch derived from the compound varies.

The chiral agent is not particularly limited, and a well-known compound (for example, Liquid Crystal Device Handbook (No. 142 Committee of Japan Society for the Promotion of Science, 1989), Chapter 3, Article 4-3, chiral agent for twisted nematic (TN) or super twisted nematic (STN), p. 199), isosorbide, or an isomannide derivative can be used.

In general, the chiral agent includes an asymmetric carbon atom. However, an axially asymmetric compound or a surface asymmetric compound not having an asymmetric carbon atom can be used as the chiral agent. Examples of the axially asymmetric compound or the surface asymmetric compound include binaphthyl, helicene, paracyclophane, and derivatives thereof. The chiral agent may include a polymerizable group. In a case where both the chiral agent and the liquid crystal compound have a polymerizable group, a polymer which includes a repeating unit derived from the polymerizable liquid crystal compound and a repeating unit derived from the chiral agent can be formed due to a polymerization reaction of a polymerizable chiral agent and the polymerizable liquid crystal compound. In this aspect, it is preferable that the polymerizable group included in the polymerizable chiral agent is the same as the polymerizable group included in the polymerizable liquid crystal compound. Accordingly, the polymerizable group of the chiral agent is preferably an unsaturated polymerizable group, an epoxy group, or an aziridinyl group, more preferably an unsaturated polymerizable group, and still more preferably an ethylenically unsaturated polymerizable group.

In addition, the chiral agent may be a liquid crystal compound.

As described below, in a case where the size of the helical pitch of the cholesteric liquid crystalline phase is controlled by light irradiation during the formation of the cholesteric liquid crystal layer, a chiral agent capable of changing the helical pitch of the cholesteric liquid crystalline phase in response to light (hereinafter, also referred to as "photosensitive chiral agent") is preferably used.

The photosensitive chiral agent is a compound that absorbs light to change the structure and can change the helical pitch of the cholesteric liquid crystalline phase. As this compound, a compound that causes at least one of a photoisomerization reaction, a photodimerization reaction, or a photodegradation reaction to occur is preferable.

The compound that causes a photoisomerization reaction to occur refers to a compound that causes stereoisomerization or structural isomerization to occur due to the action of light. Examples of the photoisomerizable compound include an azobenzene compound and a spiropyran compound.

In addition, the compound that causes a photodimerization reaction to occur refers to a compound that causes an addition reaction between two groups for cyclization by light irradiation. Examples of the photodimerizable compound include a cinnamic acid derivative, a coumarin derivative, a chalcone derivative, and a benzophenone derivative.

Preferable examples of the photosensitive chiral agent include a chiral agent represented by the following Formula (I). This chiral agent can change an aligned structure such as the helical pitch (twisting force, helical twist angle) of the cholesteric liquid crystalline phase according to the light amount during light irradiation.

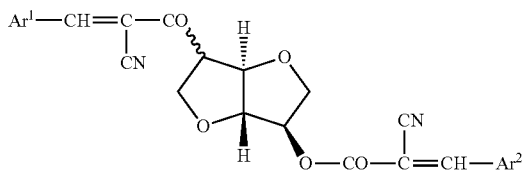

Formula (I)

In Formula (I), $Ar^1$ and $Ar^2$ represents an aryl group or a heteroaromatic ring group.

The aryl group represented by $Ar^1$ and $Ar^2$ may have a substituent and has preferably 6 to 40 carbon atoms in total and more preferably 6 to 30 carbon atoms in total. As the substituent, for example, a halogen atom, an alkyl group, an alkenyl group, an alkynyl group, an alkoxy group, a hydroxyl group, an acyl group, an alkoxycarbonyl group, an aryloxycarbonyl group, an acyloxy group, a carboxyl group, a cyano group, or a heterocyclic group is preferable, and a halogen atom, an alkyl group, an alkenyl group, an alkoxy group, a hydroxyl group, an acyloxy group, an alkoxycarbonyl group, or an aryloxycarbonyl group is more preferable.

Examples of another preferable aspect of the substituent include a substituent having a polymerizable group. Examples of the polymerizable group include an unsaturated polymerizable group, an epoxy group, and an aziridinyl group. Among these, an acryloyl group or a methacryloyl group is preferable.

It is preferable that the substituent having a polymerizable group may further include an arylene group. Examples of the arylene group include a phenylene group.

Examples of a preferable aspect of the substituent having a polymerizable group include a group represented by Formula (A). * represents a binding site.

(Formula (A))

Ar represents an arylene group. P represents a polymerizable group.

$L^{A1}$ and $L^{A2}$ each independently represent a single bond or a divalent linking group. Examples of the divalent linking group include —O—, —S—, —NR$^F$— (R$^F$ represents a hydrogen atom or an alkyl group), —CO—, an alkylene group, an arylene group, and a combination thereof (for example, —O-alkylene group-O—).

n represents 0 or 1.

Among these aryl group, an aryl group represented by the following Formula (III) or (IV) is preferable.

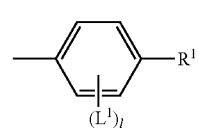

Formula (III)

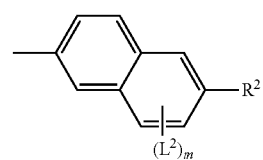

Formula (IV)

$R^1$ in Formula (III) and $R^2$ in Formula (IV) each independently represent a hydrogen atom, a halogen atom, an alkyl group, an alkenyl group, an alkynyl group, an aryl group, a heterocyclic group, an alkoxy group, a hydroxyl group, an acyl group, an alkoxycarbonyl group, an aryloxycarbonyl group, an acyloxy group, a carboxyl group, a cyano group, or the above-described substituent having a polymerizable group (preferably the group represented by Formula (A)). Among these, a hydrogen atom, a halogen atom, an alkyl group, an alkenyl group, an aryl group, an alkoxy group, a hydroxyl group, an alkoxycarbonyl group, an aryloxycarbonyl group, an acyloxy group, or the above-described substituent having a polymerizable group (preferably the group represented by Formula (A)) is preferable, an alkoxy group, a hydroxyl group, an acyloxy group, or the above-described substituent having a polymerizable group (preferably the group represented by Formula (A)) is more preferable.

$L^1$ in Formula (III) and $L^2$ in Formula (IV) each independently represent a halogen atom, an alkyl group, an alkoxy group, or a hydroxyl group and preferably an alkoxy group having 1 to 10 carbon atoms or a hydroxyl group.

l represents 0 or an integer of 1 to 4 and preferably 0 or 1. m represents 0 or an integer of 1 to 6 and preferably 0 or 1. In a case where l and m represent 2 or more, $L^1$ and $L^2$ represent different groups.

The heteroaromatic ring group represented by $Ar^1$ and $Ar^2$ may have a substituent and has preferably 4 to 40 carbon atoms and more preferably 4 to 30 carbon atoms. As the substituent, for example, a halogen atom, an alkyl group, an alkenyl group, an alkynyl group, an aryl group, an alkoxy group, a hydroxyl group, an acyl group, an alkoxycarbonyl group, an aryloxycarbonyl group, an acyloxy group, or a cyano group is preferable, and a halogen atom, an alkyl group, an alkenyl group, an aryl group, an alkoxy group, or an acyloxy group is more preferable.

Examples of the heteroaromatic ring group include a pyridyl group, a pyrimidinyl group, a furyl group, and a benzofuranyl group. Among these, a pyridyl group or a pyrimidinyl group is preferable.

Examples of the chiral agent are as follows.

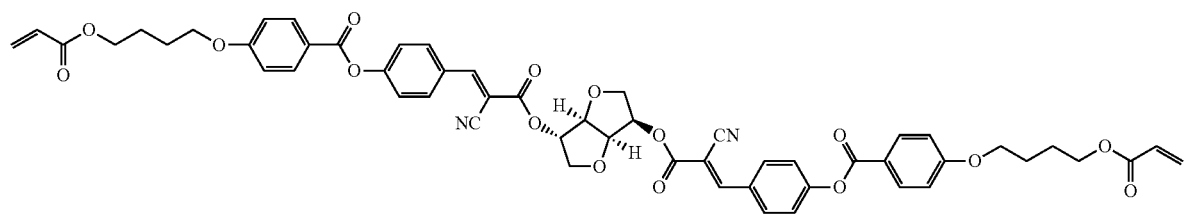
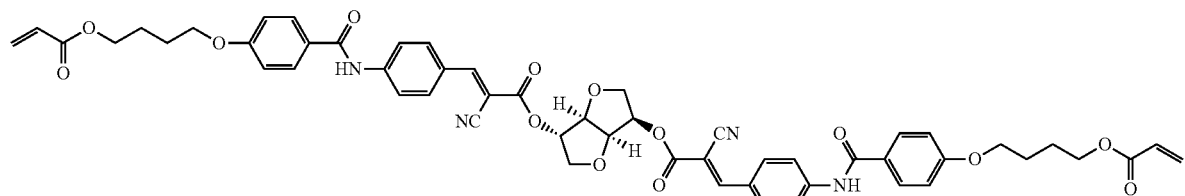
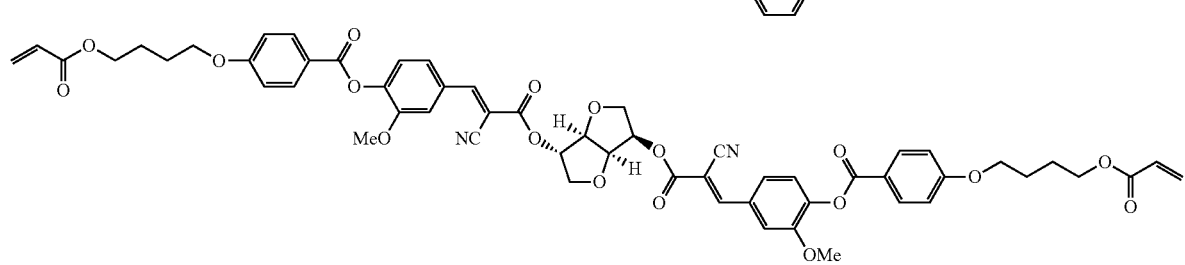
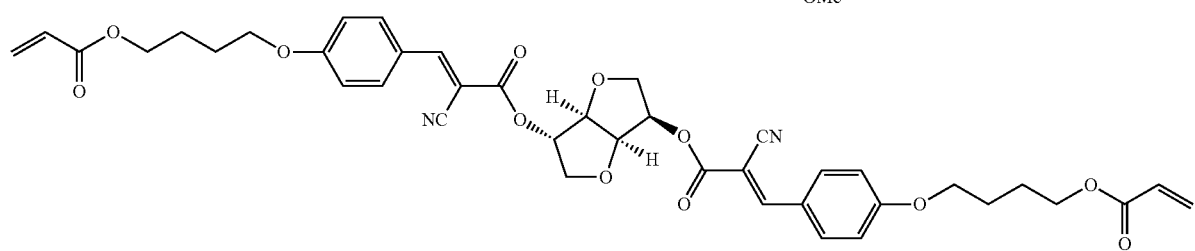
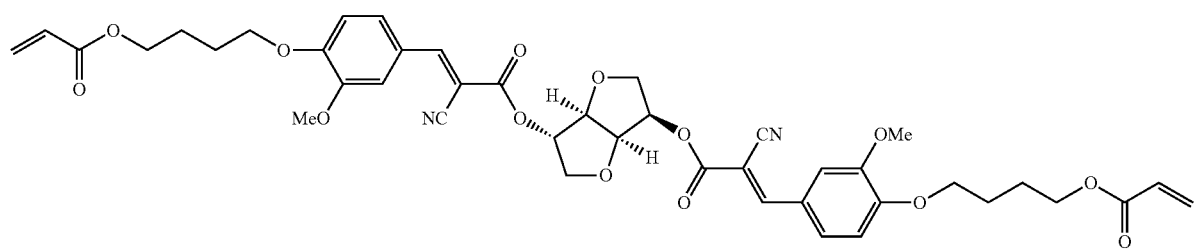
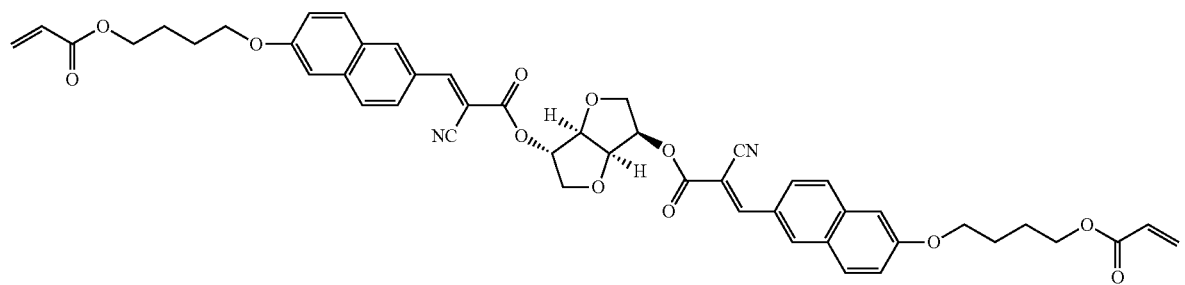
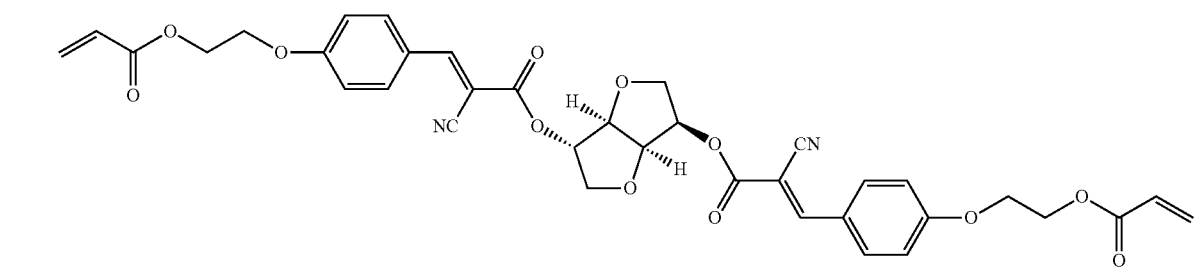

-continued
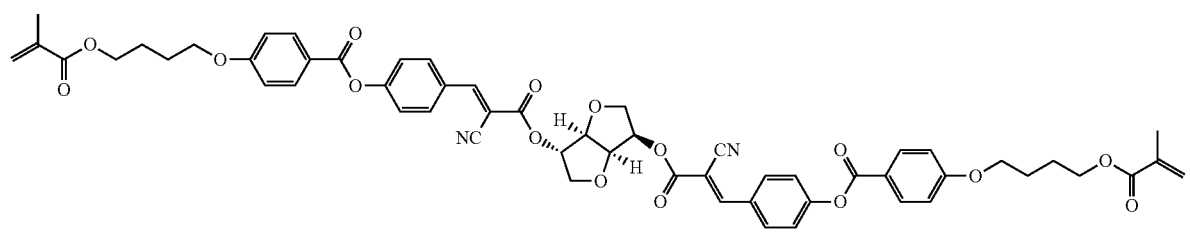
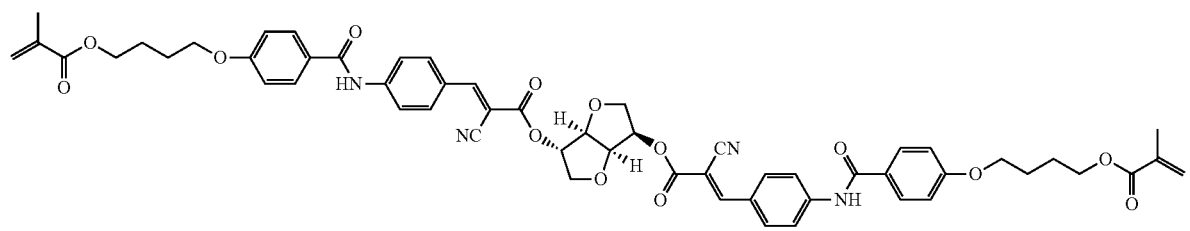
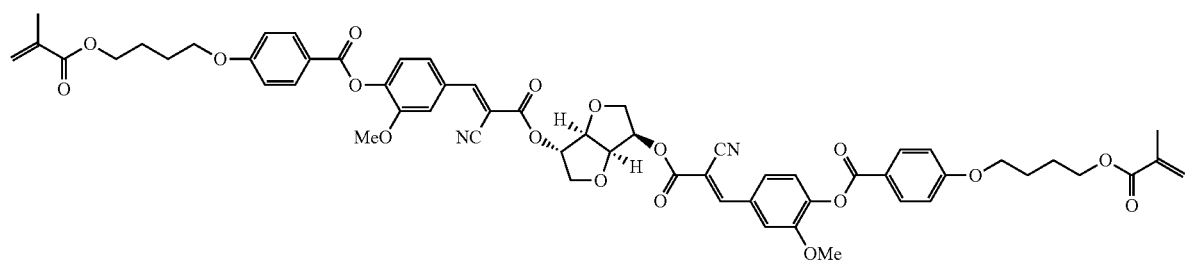
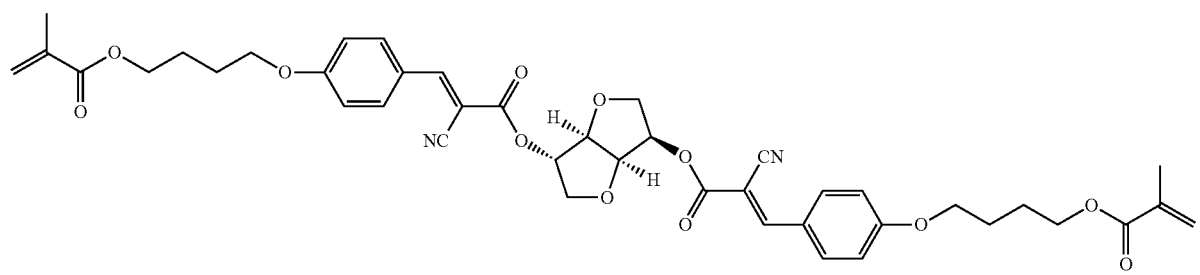
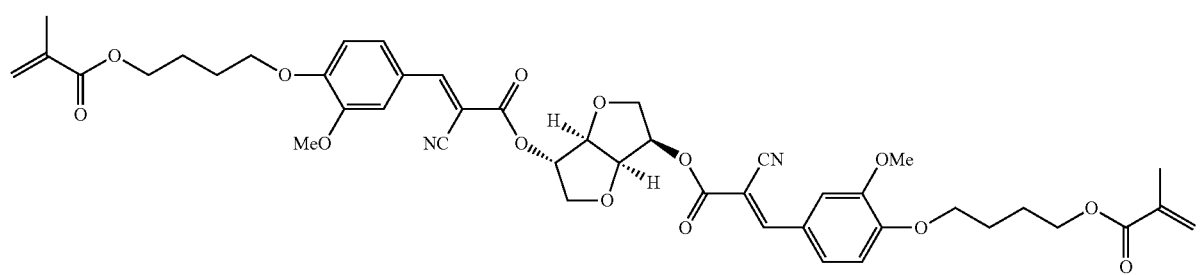
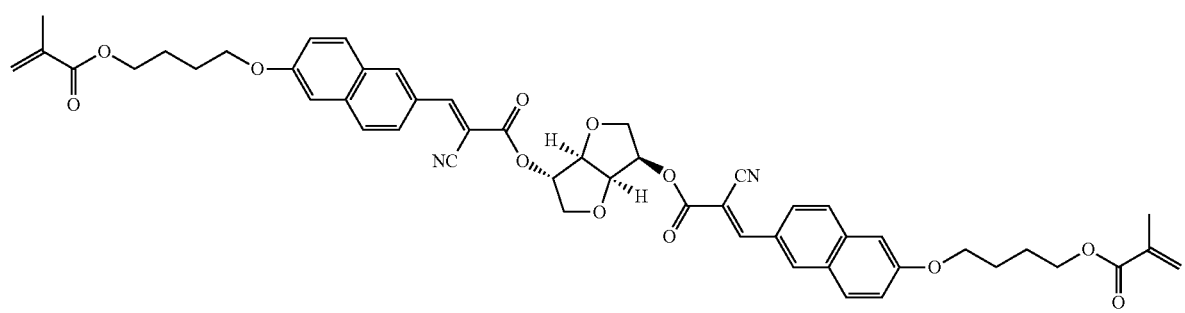

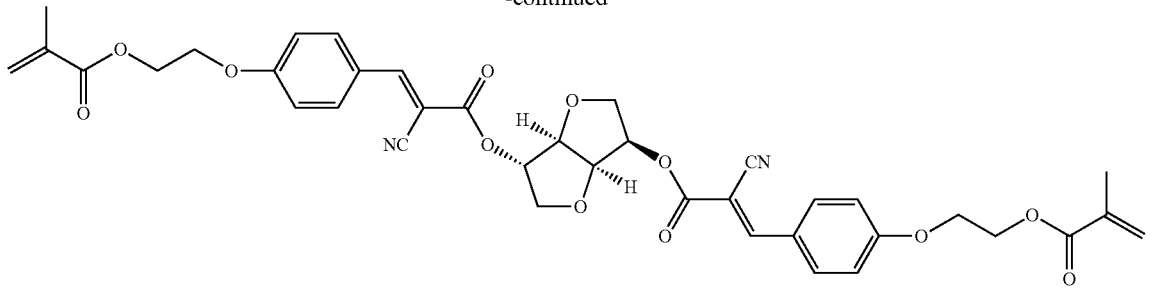

The content of the chiral agent in the liquid crystal composition is preferably 0.01 mol % to 200 mol % and more preferably 1 mol % to 30 mol % with respect to the amount of the polymerizable liquid crystal compound.

——Polymerization Initiator——

In a case where the liquid crystal composition includes a polymerizable compound, it is preferable that the liquid crystal composition includes a polymerization initiator. In a configuration where a polymerization reaction progresses with ultraviolet irradiation, it is preferable that the polymerization initiator is a photopolymerization initiator which initiates a polymerization reaction with ultraviolet irradiation. Examples of the photopolymerization initiator include an α-carbonyl compound (described in U.S. Pat. Nos. 2,367,661A and 2,367,670A), an acyloin ether (described in U.S. Pat. No. 2,448,828A), an α-hydrocarbon-substituted aromatic acyloin compound (described in U.S. Pat. No. 2,722,512A), a polynuclear quinone compound (described in U.S. Pat. Nos. 3,046,127A and 2,951,758A), a combination of a triarylimidazole dimer and p-aminophenyl ketone (described in U.S. Pat. No. 3,549,367A), an acridine compound and a phenazine compound (described in JP1985-105667A (JP-S60-105667A) and U.S. Pat. No. 4,239,850A), and an oxadiazole compound (described in U.S. Pat. No. 4,212,970A).

The content of the photopolymerization initiator in the liquid crystal composition is preferably 0.1 to 20 mass % and more preferably 0.5 mass % to 12 mass % with respect to the content of the polymerizable liquid crystal compound.

——Crosslinking Agent——

In order to improve the film hardness after curing and to improve durability, the liquid crystal composition may include a crosslinking agent. As the crosslinking agent, a curing agent which can perform curing with ultraviolet light, heat, moisture, or the like can be preferably used.

The crosslinking agent is not particularly limited and can be appropriately selected depending on the purpose. Examples of the crosslinking agent include: a polyfunctional acrylate compound such as trimethylol propane tri(meth)acrylate or pentaerythritol tri(meth)acrylate; an epoxy compound such as glycidyl (meth)acrylate or ethylene glycol diglycidyl ether; an aziridine compound such as 2,2-bis hydroxymethyl butanol-tris[3-(1-aziridinyl)propionate] or 4,4-bis(ethyleneiminocarbonylamino)diphenylmethane; an isocyanate compound such as hexamethylene diisocyanate or a biuret type isocyanate; a polyoxazoline compound having an oxazoline group at a side chain thereof; and an alkoxysilane compound such as vinyl trimethoxysilane or N-(2-aminoethyl)-3-aminopropyltrimethoxysilane. In addition, depending on the reactivity of the crosslinking agent, a well-known catalyst can be used, and not only film hardness and durability but also productivity can be improved. As the crosslinking agent, one kind may be used alone, or two or more kinds may be used in combination.

The content of the crosslinking agent is preferably 3 mass % to 20 mass % and more preferably 5 mass % to 15 mass %. In a case where the content of the crosslinking agent is lower than 3 mass %, an effect of improving the crosslinking density may not be obtained. In a case where the content of the crosslinking agent is higher than 20 mass %, the stability of a cholesteric liquid crystal layer may deteriorate.

——Other Additives——

Optionally, a surfactant, a polymerization inhibitor, an antioxidant, a horizontal alignment agent, an ultraviolet absorber, a light stabilizer, a coloring material, metal oxide particles or the like can be added to the liquid crystal composition in a range where optical performance and the like do not deteriorate.

The liquid crystal composition may include a solvent. The solvent is not particularly limited and can be appropriately selected depending on the purpose. An organic solvent is preferably used.

The organic solvent is not particularly limited and can be appropriately selected depending on the purpose. Examples of the organic solvent include a ketone such as methyl ethyl ketone or methyl isobutyl ketone, an alkyl halide, an amide, a sulfoxide, a heterocyclic compound, a hydrocarbon, an ester, and an ether. As the organic solvent, one kind may be used alone, or two or more kinds may be used in combination. Among these, a ketone is more preferable in consideration of an environmental burden. The above-described component such as the above-described monofunctional polymerizable monomer may function as the solvent.

(Multi-Layer Polymer Film)

The multi-layer polymer film used as the transflective film is, for example, as follows.

[Interference Film including Laminate of Organic Layers]

The details of an interference film including a laminate of organic layers can be found in, for example, JP1997-506837A (JP-H9-506837A) or JP2007-271896A. Referring to this document, organic layers having different refractive indices are alternately laminated using various organic materials to prepare an interference film. By adjusting the material and the thickness, a selective reflecting layer that exhibits selective reflection having a center wavelength in a wavelength range of 450 nm to 500 nm at a half-width 20 nm to 45 nm can be formed. Examples of a commercially available product include DBEF (registered trade name) (manufactured by 3M).

As described in JP2007-271896A, in a case where light is obliquely incident into an interference film including a laminate of organic layers, the apparent center wavelength of the selective reflection shifts to the short wavelength side as in the cholesteric liquid crystal layer. Accordingly, as in the case where cholesteric liquid crystal layer is used, a lens for eye glasses that is prepared using an interference film including a laminate of organic layers looks yellow when seen from an oblique side.

In the interference film including the laminate of the organic layers, the thickness of each of the organic layers is preferably 50 nm to 500 nm and more preferably 100 nm to 300 nm. The total thickness of the interference film including the laminate of the organic layers is preferably in a range of 1.0 µm to 30 µm and more preferably in a range of 5.0 µm to 30 µm.

(λ/4 Plate)

The λ/4 plate (plate having a λ/4 function) is a plate having a function of converting linearly polarized light having a specific wavelength into circularly polarized light or converting circularly polarized light into linearly polarized light. More specifically, the λ/4 plate is plate in which an in-plane retardation value at a specific wavelength λ nm satisfies Re (λ)=λ/4 (or an odd number of times thereof). This expression only has to be satisfied at any wavelength (for example, 550 nm) in a visible range.

The λ/4 plate may have a configuration in which only an optically-anisotropic layer having a λ/4 function is formed or a configuration in which an optically-anisotropic layer having a λ/4 function is formed on a support. In a case where the λ/4 plate includes the support, a combination of the support and the optically-anisotropic layer is the λ/4 plate.

As the λ/4 plate, a well-known λ/4 plate can be used.

In addition, in the λ/4 plate of the imaging device according to the embodiment of the present invention, it is preferable that a thickness-direction retardation Rth (550) is as low as possible.

Specifically, Rth (550) is preferably −50 nm to 50 nm and more preferably −30 nm to 30 nm, and it is still more preferably that Rth (λ) is zero. As a result, the result that is preferable from the viewpoint of converting circularly polarized light which is obliquely incident into the λ/4 plate into linearly polarized light can be obtained.

In the imaging device according to the embodiment of the present invention, it is preferable that, in a case where a phase difference of the λ/4 plate at an incidence angle θ° is represented by Re (θ), the λ/4 plate satisfies |ΔRe (0)|<50 at any wavelength of 400 nm to 700 nm.

As a result, a color or a pattern of a cholesteric liquid crystal layer is not likely to be transferred to the imaging device with respect to light from the front direction.

Here, |ΔRe (θ)| refers to an absolute value of a difference between a value of ¼×λ of the incidence light at a wavelength λ and a value of the phase difference of the λ/4 plate. That is, |ΔRe (θ)|=|¼×λ−Re (θ)|.

Examples of the λ/4 plate that satisfies the above-described condition include PURE ACE S-148 (manufactured by Teijin Ltd.), a laminate product of a liquid crystal ½ wave plate and a liquid crystal ¼ wave plate (manufactured by Fujifilm Corporation), and a liquid crystal ¼ wave plate (manufactured by Fujifilm Corporation).

In the imaging device according to the embodiment of the present invention, it is more preferable that, in a case where a phase difference of the λ/4 plate at an incidence angle θ° is represented by Re (θ), the λ/4 plate satisfies |ΔRe (60)|<50 at any wavelength of 400 nm to 700 nm, and in a case where a phase difference at an incidence angle θ° and an incidence wavelength λ nm is represented by ΔRe (θ,λ), the λ/4 plate satisfies |ΔRe (60,450)|<|ΔRe (60,650)|.

As a result, a color or a pattern of a cholesteric liquid crystal layer is also not likely to be transferred to the imaging device with respect to light from the oblique direction.

Here, in a case where a phase difference at an incidence angle θ° and an incidence wavelength λ nm is represented by ΔRe (θ,λ), |ΔRe (θ,λ)| represents an absolute value of a difference between a value of ¼×λ at each wavelength and a value of the phase difference. That is, |ΔRe (θ,λ)|=|¼×λ−Re (θ,λ)|.

Examples of the λ/4 plate that satisfies the above-described condition include PURE ACE S-148 (manufactured by Teijin Ltd.).

(Linear Polarizing Plate)

The linear polarizing plate has a polarizing axis in one direction and has a function of allowing transmission of specific linearly polarized light.

As the linear polarizing plate, a general linear polarizing plate such as an absorption polarizing plate including an iodine compound or a reflective polarizing plate including a wire grid can be used. The polarizing axis has the same definition as a transmission axis.

As the absorption polarizing plate, for example, any of an iodine polarizing plate, a dye polarizing plate using a dichroic dye, or a polyene polarizing plate can be used. The iodine polarizing plate or the dye polarizing plate can be generally prepared by adsorbing iodine or a dichroic dye to polyvinyl alcohol and stretching the film.

(Adhesive Layer)

In the imaging device according to the embodiment of the present invention, in a case where the blocking member, the transflective film, the λ/4 plate, and the linear polarizing plate are laminated in contact with each other, the components may be bonded to each other through an adhesive layer.

As the adhesive layer, any adhesive layer formed of one of well-known various materials can be used as long as it is a material that can bond a layer (sheet-like material) as a target. The adhesive layer may be a layer formed of an adhesive that has fluidity during bonding and becomes a solid after bonding, a layer formed of a pressure sensitive adhesive that is a gel-like (rubber-like) flexible solid during bonding and of which the gel state does not change after bonding, or a layer formed of a material having characteristics of both the adhesive and the pressure sensitive adhesive. Accordingly, the adhesive layer may be any well-known layer that is used for bonding a sheet-like material, for example, an optical clear adhesive (OCA), an optically transparent double-sided tape, or an ultraviolet curable resin.

(Circularly Polarizing Plate)

As described above, a laminate in which the λ/4 plate and the linear polarizing plate are bonded to each other functions as the circularly polarizing plate. In the present invention, it is preferable that, in a case where a circular polarization degree of the circularly polarizing plate at an incidence angle θ° is represented by D (θ) and an absolute value of the circular polarization degree is represented by |D (θ)|, the circularly polarizing plate satisfies |D (θ)|>0.8 at any wavelength of 400 nm to 700 nm.

Further, in the present invention, it is more preferable that, in a case where a circular polarization degree of the circularly polarizing plate at an incidence angle θ° is represented by D (θ) and an absolute value of the circular polarization degree is represented by |D (θ)|, the circularly polarizing plate constantly satisfies |D (60)|>0.8 at any wavelength of 400 nm to 700 nm, and that, in a case where a circular polarization degree of the circularly polarizing plate at an incidence angle θ° and an incidence wavelength λ, nm is represented by D (θ,λ) and an absolute value of the circular polarization degree is represented by |D (θ,λ)|, the circularly polarizing plate constantly satisfies |D (60,450)|>|D (60, 650)|.

As a result, a color or a pattern of a cholesteric liquid crystal layer is also not likely to be transferred to the imaging device with respect to light from the oblique direction.

In a case where a strength of a right circularly polarized light component of light is represented by $I_R$ and a strength of a left circularly polarized light component of the light is represented by $I_L$, $I_R-I_L/(I_R+I_L)$ is defined as the circular polarization degree.

The polarization state of light can be represented by the sum of the right and left circularly polarized light components. For example, in a case where the intensities of the right and left circularly polarized light components are the same as each other, the sum thereof represents linearly polarized light, and the electric vector thereof oscillates in a direction determined depending on the phase difference between the left circularly polarized light and the right circularly polarized light. In a case where the intensities of the right and left circularly polarized light components are different from each other, the sum thereof represents elliptically polarized light. In a case where any one of the components is present, the sum represents complete circularly polarized light.

In addition, in a case where light is observed such that the propagates toward the front side, the sense of circularly polarized light is defined as follows: in a case where a distal end of an electric field vector rotates clockwise along with an increase in time, the light is right circularly polarized light; and in a case where a distal end of an electric field vector rotates counterclockwise along with an increase in time, the light is left circularly polarized light.

(Method of Forming Cholesteric Liquid Crystal Layer)

Figure 14:
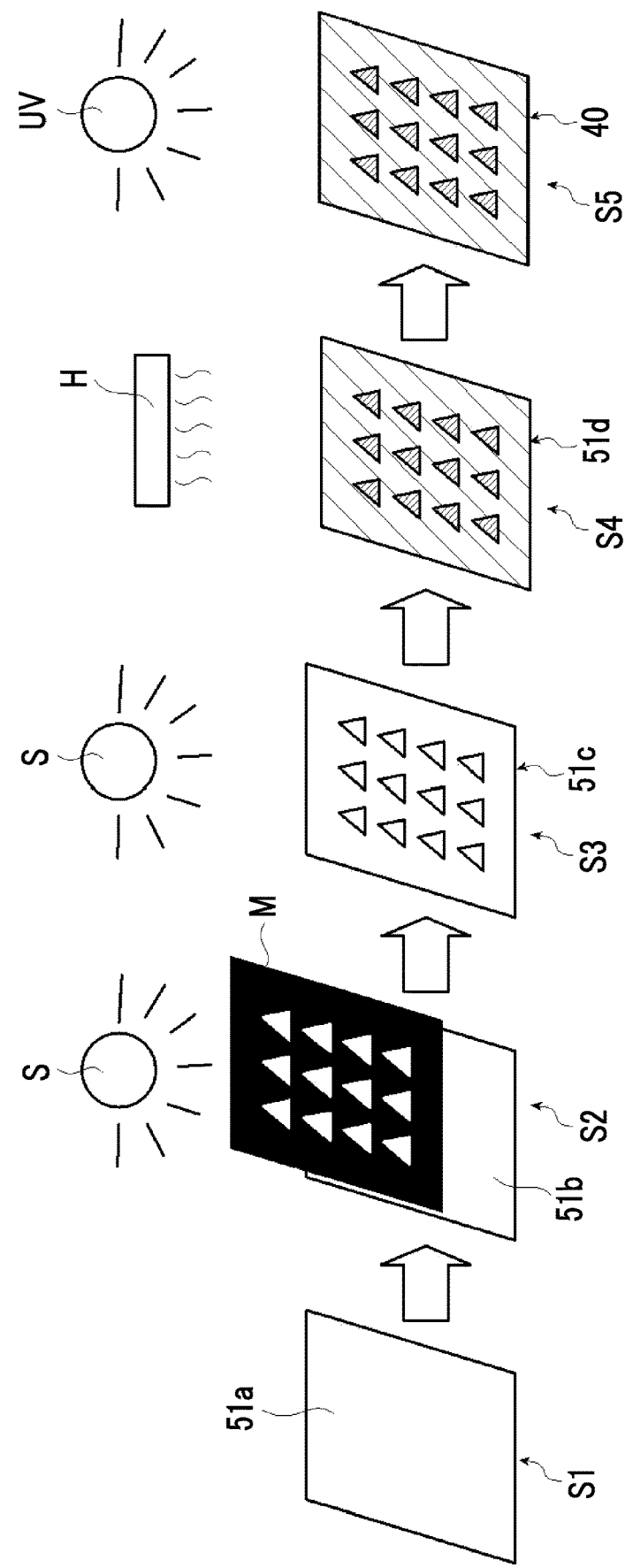
FIG. 14 is a schematic diagram illustrating one example of a method of forming a reflection film.

Next, a method of forming the cholesteric liquid crystal layer that includes two or more reflecting regions having different selective reflection wavelengths will be described using FIG. 14.

First, in Step S1, a liquid crystal composition including a polymerizable liquid crystal compound and a photosensitive chiral agent is applied to a temporary support (not illustrated) to form a coating layer 51a. As a coating method, a well-known method can be used. In addition, optionally, the liquid crystal composition may be applied and then dried.

Next, in Step S2, using an exposure device S that emits light having a wavelength at which the photosensitive chiral agent is photosensitive, the coating layer 51a is exposed through a mask M having a predetermined opening pattern to form a coating layer 51b a part of which is exposed. In the exposed portion of the coating layer 51b, the photosensitive chiral agent senses light such that a structure thereof changes.

Next, in Step S3, the mask M is removed, and light having a wavelength at which the photosensitive chiral agent is photosensitive is emitted again from the exposure device S to expose the coating layer 51b such that an exposed coating layer 51c is formed.

Next, in Step S4, the coating layer 51c is heated (aged) using a heater H to form a heated coating layer 51d. In the coating layer 51d, the liquid crystal compound is aligned to form the cholesteric liquid crystalline phase. In the coating layer 51d, two regions having different exposure doses are present. In each of the regions, the length of the helical pitch of the cholesteric liquid crystalline phase varies depending on the exposure dose. As a result, two reflecting regions having different selective reflection wavelength are formed.

Next, in Step S5, the coating layer 51d is cured by ultraviolet irradiation using an ultraviolet irradiation device UV to form a cholesteric liquid crystal layer 40 that is a layer obtained by immobilizing a cholesteric liquid crystalline phase.

The method of forming the cholesteric liquid crystal layer that includes two or more reflecting regions having different selective reflection wavelengths using the photosensitive chiral agent has been described above. However, the present invention is not limited to this aspect. For example, another well-known method such as a method described in JP2009-300662A can be adopted.

In addition, in the example, the liquid crystal composition is applied to the temporary support to form the coating layer 51a, but the present invention is not limited thereto. In addition to the application, for example, an ink jet method, a printing method, or a spray coating method may be used.

In addition, as a method of forming the cholesteric liquid crystal layer, a laser drawing exposure device can also be used. In a case where a non-cured cholesteric liquid crystal layer (coating layer) is irradiated with light, by adjusting the exposure dose, the number of times of exposure, the exposure time, and the like depending on the positions of the layer using a laser drawing exposure device, a cholesteric liquid crystal layer having a desired pattern shape can be obtained.

In addition, in a case where a cholesteric liquid crystal layer in which a cholesteric liquid crystalline phase is not immobilized is formed, the cholesteric liquid crystal layer can be prepared using the forming method in which Step S1 to Step S4 are performed without performing Step S5.

Further, in a case where a liquid crystal compound that can be aligned at room temperature is used, the cholesteric liquid crystal layer can be formed without performing heating in step S4.

In addition, in the above-described example, the imaging device displays a static image using reflected light from the cholesteric liquid crystal layer, but the present invention is not limited thereto.

For example, referring to a method described in US2016/0033806A, JP5071388B, or OPTICS EXPRESS 2016 vol. 24 No. 20 P23027-23036, the alignment of the liquid crystal phase of the cholesteric liquid crystal layer may be made to be variable by applying a voltage or changing a temperature without curing the cholesteric liquid crystal layer with ultraviolet light (UV) such that the pattern of the cholesteric liquid crystal layer is changed to make a picture, a character, or the like to be displayed variable, that is, to display a moving image.

Hereinabove, the imaging device according to the embodiment of the present invention has been described above. However, the present invention is not limited to the above-described examples, and various improvements and modifications can be made within a range not departing from the scope of the present invention.

EXAMPLES

Hereinafter, the characteristics of the present invention will be described in, detail using examples. Materials, chemicals, used amounts, material amounts, ratios, treatment details, treatment procedures, and the like shown in the following examples can be appropriately changed, within a range not departing from the scope of the present invention.

Accordingly, the scope of the present invention is not limited to the following specific examples.

Example 1

<Preparation of Forming Cholesteric Liquid Crystal Layer>
(Preparation of Liquid Crystal Composition 1)
The following components were mixed with each other to prepare a liquid crystal composition 1.

| | |
|---|---|
| Liquid crystal compound 1 (the following structure): | 1 g |
| Chiral agent 1 (the following structure): | 98 mg |
| Horizontal alignment agent 1 (the following structure): | 0.2 mg |
| Horizontal alignment agent 2 (the following structure): | 0.5 mg |
| Photoradical initiator 1 (the following structure): | 40 mg |
| Polymerization inhibitor 1 (the following structure): | 10 mg |
| Methyl ethyl ketone (MEK): | 1.6 g |

Polymerization Inhibitor 1 (Manufactured by BASF SE, IRGANOX 1010 (the Following Structure))

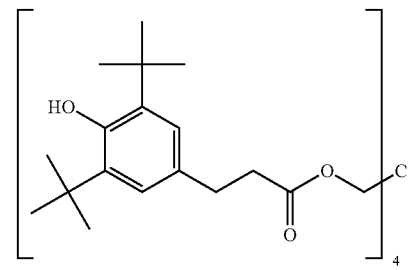

As a substrate for forming the cholesteric liquid crystal layer, a substrate in which an orientation adjusting layer was formed on a PET film was used.

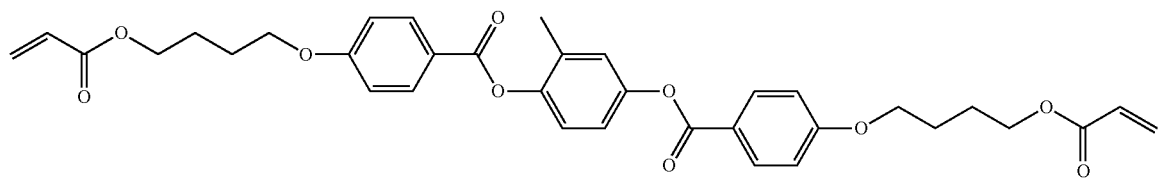

Liquid Crystal Compound 1

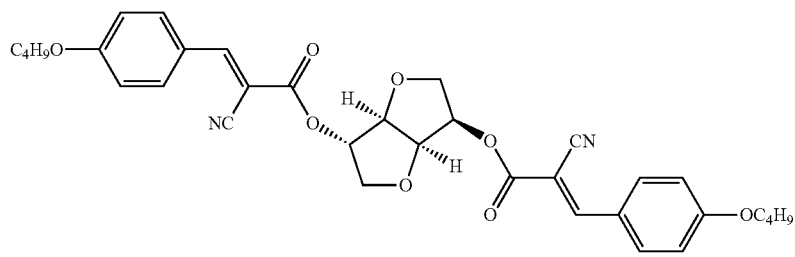

Chiral Agent 1

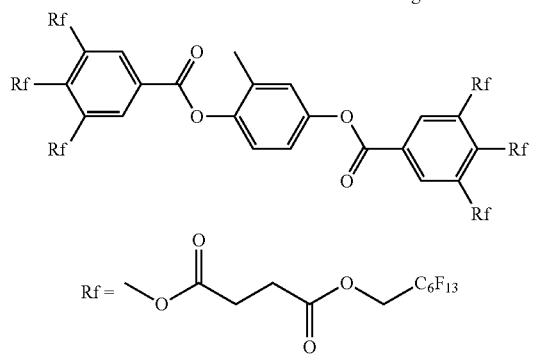

Horizontal Alignment Agent 1

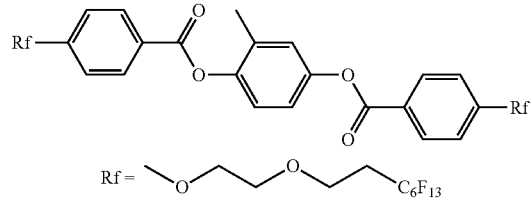

Horizontal Alignment Agent 2

Photoradical Initiator 1 (Manufactured by BASF SE, IRGACURE 907 (the Following Structure))

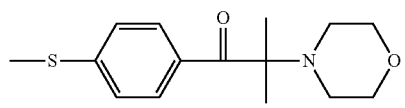

Specifically, the following acrylic solution was applied using a bar coating method to a polyethylene terephthalate film (PET film, COSMOSHINE A4100, manufactured by Toyobo Co., Ltd.) having a thickness of 100 μm such that the thickness of the coating film was about 2 to 5 μm, and was irradiated with UV in a nitrogen atmosphere at 60° C. and 300 mJ/cm² to be cured. As a result, the orientation adjusting layer was formed.

(Composition of Acrylic Solution)

| | |
|---|---|
| VANARESIN GH-1203 (manufactured by Shin-Nakamura Chemical Co., Ltd.) | 48 wt % |
| VISCOAT #360 (manufactured by Osaka Organic Chemical Industry Ltd.) | 48 wt % |
| IRGACURE 819 (manufactured by BASF SE) | 3.99 wt % |
| The above-described horizontal alignment agent 1 | 0.01 wt % |

MEK and methyl isobutyl ketone (MIBK; mass ratio, 1 wt %:1 wt %) were adjusted such that the solid content thereof was 30 wt5.

Next, the liquid crystal composition 1 was applied to the orientation adjusting layer using a wire bar at room temperature and then was dried to form a coating film (was adjusted such that the thickness of the dried coating film (dry film) was about 2 to 5 μm.

The obtained coating film was irradiated with UV through a black mask having an opening in an oxygen atmosphere at room temperature for a predetermined time. At this time, the black density of the mask was adjusted such that the exposure dose of a region where the mask was not provided (region where the opening was positioned) was 15 mJ/cm² and the exposure dose of a region where light was not blocked by the mask was 5 mJ/cm².

In Examples, as a light source for UV irradiation, "UV transilluminator LM-26 type" (exposure wavelength: 365 nm, manufactured by Funakoshi Co., Ltd.) was used in the step of exposing the coating film in a pattern shape (pitch adjusting step), and "EXECURE 3000-W" (manufactured by Hoya Candeo Optronics Corporation) was used in a curing step described below.

Next, the PET film on which the above-described coating film was formed was left to stand on a hot plate at 100° C. for 1 minute to perform a heat treatment on the coating film such that the state of the cholesteric liquid crystalline phase was obtained.

Next, after the heat treatment, the coating film was irradiated with UV in a nitrogen atmosphere (oxygen concentration: 500 ppm or lower) at room temperature for a predetermined time to cure the coating film. As a result, the cholesteric liquid crystal layer was formed. The cholesteric liquid crystal layer obtained through the above-described steps exhibits right circularly polarized light reflecting properties and has two reflecting regions having different selective reflection wavelengths.

<Preparation of Imaging Device>

Figure 15:
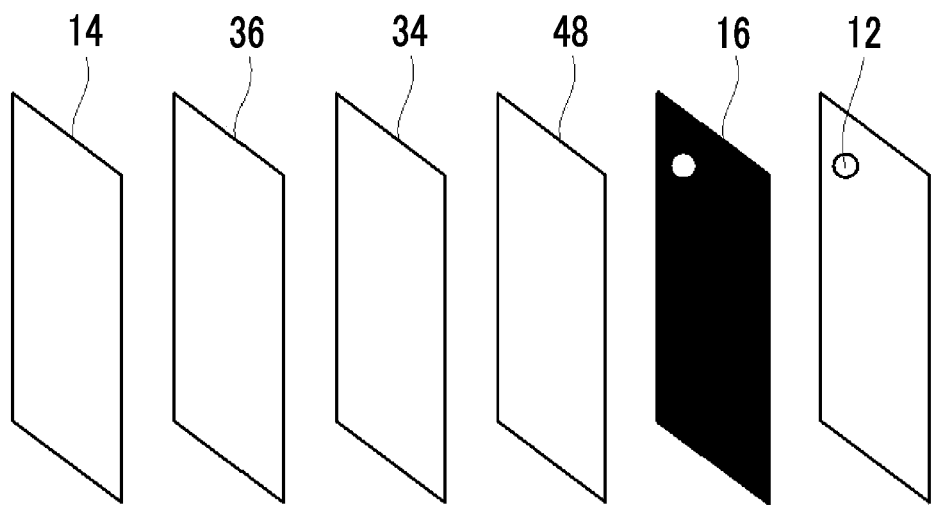
FIG. 15 is a schematic diagram illustrating a configuration of Example.

The obtained cholesteric liquid crystal layer 14, the λ/4 plate 36 (manufactured by Teijin Ltd., S-148), the linear polarizing plate 34 (manufactured by PANAC Co., Ltd., HLC-5618RE), the reflection uniformizing layer 48 (manufactured by Toyobo Co., Ltd., PET film, A4100), black paper 16 (L* of CIE-Lab (D50)=10) as the blocking member were laminated in this order and bonded to each other using an optical double-coated adhesive film ("MCS70", manufactured by MeCan Imaging Inc.) to form a laminate (refer to FIG. 15).

Further, the black paper side of the laminate was bonded to a surface side of a smartphone (manufactured by Apple Inc., iphone 5) where a camera 12 was disposed. As a result, an imaging device was prepared (refer to FIG. 15). At a position of the black camera corresponding to the camera, a through hole having substantially the same size as that of the camera 12 portion was provided.

Comparative Example 1

Instead of the laminate, colored cellophane (manufactured by Komoda Paper Co., Ltd.) was bonded to the surface side of the smartphone where the camera was disposed. As a result, an imaging device was prepared.

Example 2

An imaging device was prepared using the same method as that of Example 1, except that the following liquid crystal composition 2 was used as the liquid crystal composition for forming the cholesteric liquid crystal layer.

(Preparation of Liquid Crystal Composition 2)

| | |
|---|---|
| Liquid crystal compound 1 (the above-described structure): | 1 g |
| Polymerizable monomer 1 (the following structure): | 10 mg |
| Chiral agent 1 (the above-described structure): | 98 mg |
| Horizontal alignment agent 1 (the above-described structure): | 0.4 mg |
| Horizontal alignment agent 2 (the above-described structure): | 1.0 mg |
| Photoradical initiator 2 (the following structure): | 40 mg |
| Methyl ethyl ketone (MEK): | 1.55 g |
| Cyclohexanone: | 0.3 g |

Polymerizable Monomer 1 (Manufactured by Shin-Nakamura Chemical Co., Ltd., A-TMMT (the Following Structure))

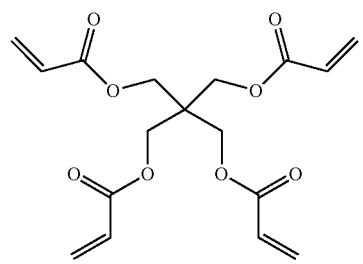 [SMILES: C=CC(=O)OCC(COC(=O)C=C)(COC(=O)C=C)COC(=O)C=C]

Photoradical Initiator 2 (Manufactured by BASF SE, IRGACURE OXE02 (the Following Structure))

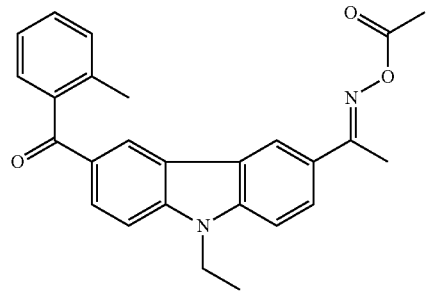 [SMILES: CCn1c2ccc(C(=O)c3ccccc3C)cc2c2cc(/C(C)=N/OC(C)=O)ccc21]

Example 3

An imaging device was prepared using the same method as that of Example 1, except that the following liquid crystal composition 3 was used as the liquid crystal composition for forming the cholesteric liquid crystal layer.

(Preparation of Liquid Crystal Composition 3)

| | |
|---|---:|
| Liquid crystal compound 1 (the above-described structure): | 1 g |
| Polymerizable monomer 1 (the above-described structure): | 10 mg |
| Chiral agent 1 (the above-described structure): | 58 mg |
| Chiral agent 2 (the following structure): | 25 mg |
| Horizontal alignment agent 1 (the above-described structure): | 0.4 mg |
| Horizontal alignment agent 2 (the above-described structure): | 1.0 mg |
| Photoradical initiator 2 (the above-described structure): | 40 mg |
| Methyl ethyl ketone (MEK): | 1.55 g |
| Cyclohexanone: | 0.3 g |

Chiral Agent 2 (Manufactured by BASF SE, Paliocolor LC756 (the Following Structure))

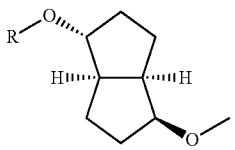

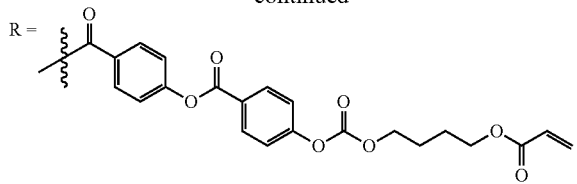

Example 4

An imaging device was prepared using the same method as that of Example 1, except that the following liquid crystal composition 4 was used as the liquid crystal composition for forming the cholesteric liquid crystal layer.

(Preparation of Liquid Crystal Composition 4)

| | |
|---|---:|
| Liquid crystal compound 1 (the above-described structure): | 1 g |
| Polymerizable monomer 1 (the above-described structure): | 10 mg |
| Chiral agent 3 (the following structure): | 67 mg |
| Horizontal alignment agent 1 (the above-described structure): | 0.4 mg |
| Horizontal alignment agent 2 (the above-described structure): | 1.0 mg |
| Photoradical initiator 1 (the above-described structure): | 20 mg |
| Methyl ethyl ketone (MEK): | 1.55 g |
| Cyclohexanone: | 0.3 g |

Chiral Agent 3 (the Following Structure)

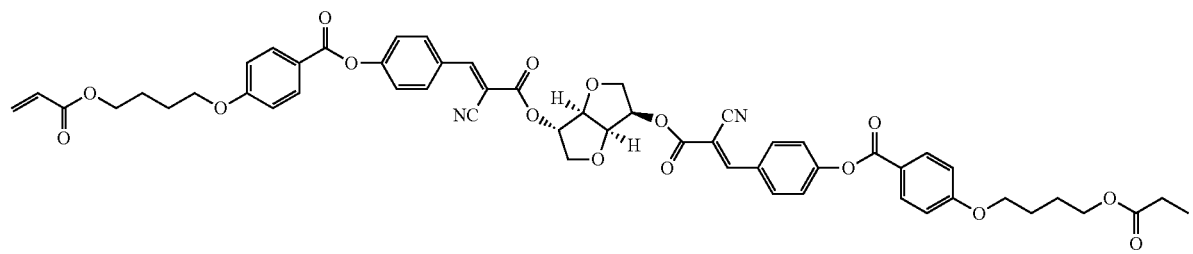 [SMILES: C=CC(=O)OCCCCOc1ccc(C(=O)Oc2ccc(/C=C(\C#N)C(=O)O[C@H]3CO[C@H]4[C@@H]3OC[C@H]4OC(=O)/C(C#N)=C/c3ccc(OC(=O)c4ccc(OCCCCOC(=O)CC)cc4)cc3)cc2)cc1]

Example 5

An imaging device was prepared using the same method as that of Example 1, except that the following liquid crystal composition 5 was used as the liquid crystal composition for forming the cholesteric liquid crystal layer.

(Preparation of Liquid Crystal Composition 5)

| | |
|---|---:|
| Liquid crystal compound 1 (the above-described structure): | 1 g |
| Polymerizable monomer 1 (the above-described structure): | 10 mg |
| Chiral agent 4 (the following structure): | 68 mg |
| Horizontal alignment agent 1 (the above-described structure): | 0.4 mg |
| Horizontal alignment agent 2 (the above-described structure): | 1.0 mg |
| Photoradical initiator 1 (the above-described structure): | 20 mg |
| Methyl ethyl ketone (MEK): | 1.55 g |
| Cyclohexanone: | 0.3 g |

Chiral Agent 4 (the Following Structure)

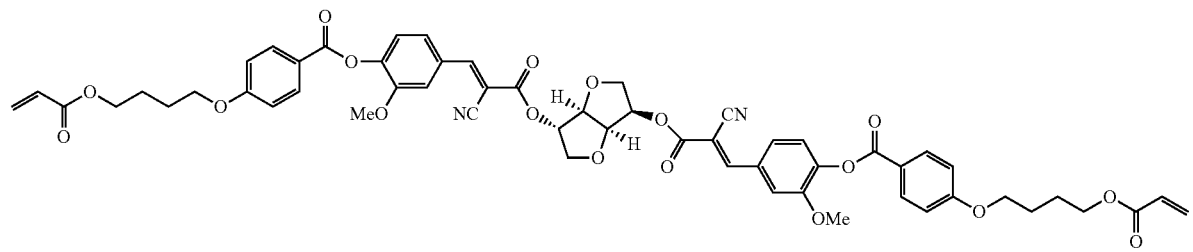 [SMILES: C=CC(=O)OCCCCOc1ccc(C(=O)Oc2ccc(/C=C(\C#N)C(=O)O[C@H]3CO[C@H]4[C@@H]3OC[C@H]4OC(=O)/C(C#N)=C/c3ccc(OC(=O)c4ccc(OCCCCOC(=O)C=C)cc4)c(OC)c3)cc2OC)cc1]

Example 6

An imaging device was prepared using the same method as that of Example 1, except that the following acrylic aqueous solution 2 was used as the coating solution for forming the orientation adjusting layer of the substrate forming the cholesteric liquid crystal layer.

(Composition of Acrylic Solution 2)

| | |
|---|---|
| KAYARAD PET30 (manufactured by Nippon Kayaku Co., Ltd.) | 100 parts by mass |
| IRGACURE 819 (manufactured by BASF SE) | 4.00 parts by mass |
| The above-described horizontal alignment agent 1 | 0.01 parts by mass |

MEK was adjusted such that the solid content was 30 wt %.

Example 7

An imaging device was prepared using the same method as that of Example 1, except that the following acrylic aqueous solution 3 was used as the coating solution for forming the orientation adjusting layer of the substrate forming the cholesteric liquid crystal layer.

(Composition of Acrylic solution 3)

| | |
|---|---|
| The above-described polymerizable monomer 1 | 100 parts by mass |
| IRGACURE 819 (manufactured by BASF SE) | 3.99 parts by mass |
| The above-described horizontal alignment agent 1 | 0.01 parts by mass |

MEK and MIBK (mass ratio, 1 wt %:1 wt %) were adjusted such that the solid content thereof was 30 wt5.

Example 8

An imaging device was prepared using the same method as that of Example 1, except that the heat treatment and the curing of the cholesteric liquid crystal layer were performed as follows.

The liquid crystal composition 1 was applied to the orientation adjusting layer and was irradiated with UV through the mask. Next, the PET film on which the coating film was formed was left to stand in a fan dryer (SPHH-202, manufactured by ESPEC Corp.) at 90° C. for 30 seconds to 1 minute to perform a heat treatment on the coating film such that the state of the cholesteric liquid crystalline phase was obtained.

Next, after the heat treatment, the coating film was irradiated with UV in a nitrogen atmosphere (oxygen concentration: 500 ppm or lower) at 80° C. for a predetermined time to cure the coating film. As a result, the cholesteric liquid crystal layer was formed. The cholesteric liquid crystal layer obtained through the above-described steps exhibits right circularly polarized light reflecting properties and has two reflecting regions having different selective reflection wavelengths.

Example 9

Figure 19:
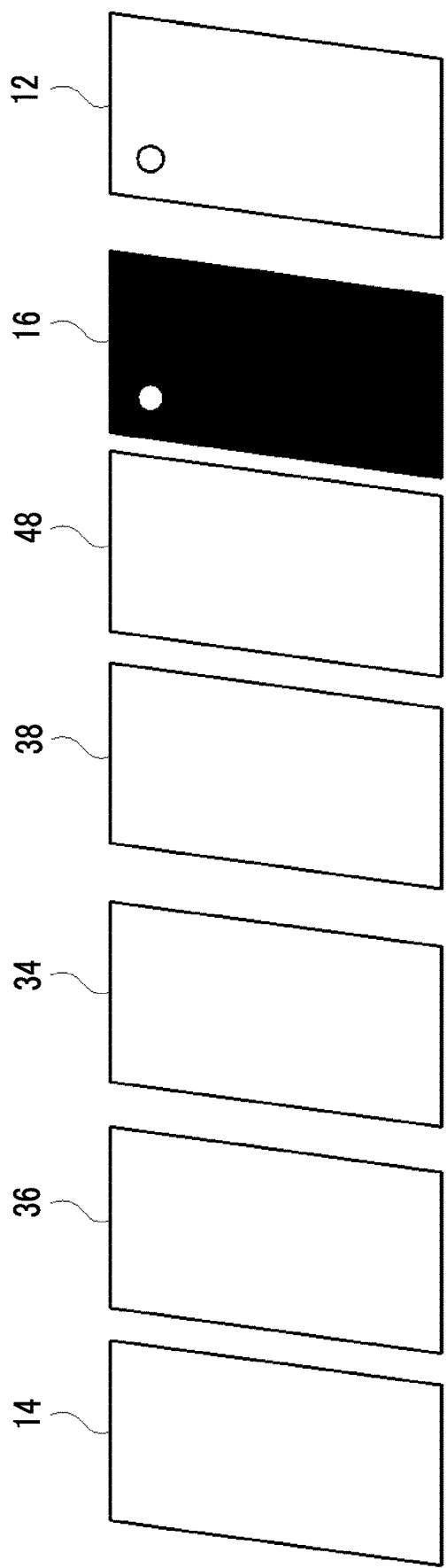
FIG. 19 is a schematic diagram illustrating a configuration of Example.

An imaging device was prepared using the same method as that of Example 1, except that the configuration of the laminate was adjusted as illustrated in FIG. 19 such that the cholesteric liquid crystal layer 14, the λ/4 plate 36, the linear polarizing plate 34, the second λ/4 plate 38 (manufactured by Teijin Ltd., S-148), the reflection uniformizing layer 48 (TAC film), and a black PET film as the blocking member 16 were laminated in this order and bonded to each other.

As the black PET film, trade name "KUKKIRI MIERU" (manufactured by Tomoegawa Co., Ltd.) was used, and a plurality of black PET films were laminated such that L*=10 in the CIE-Lab (D50) color space.

Example 10

Figure 20:
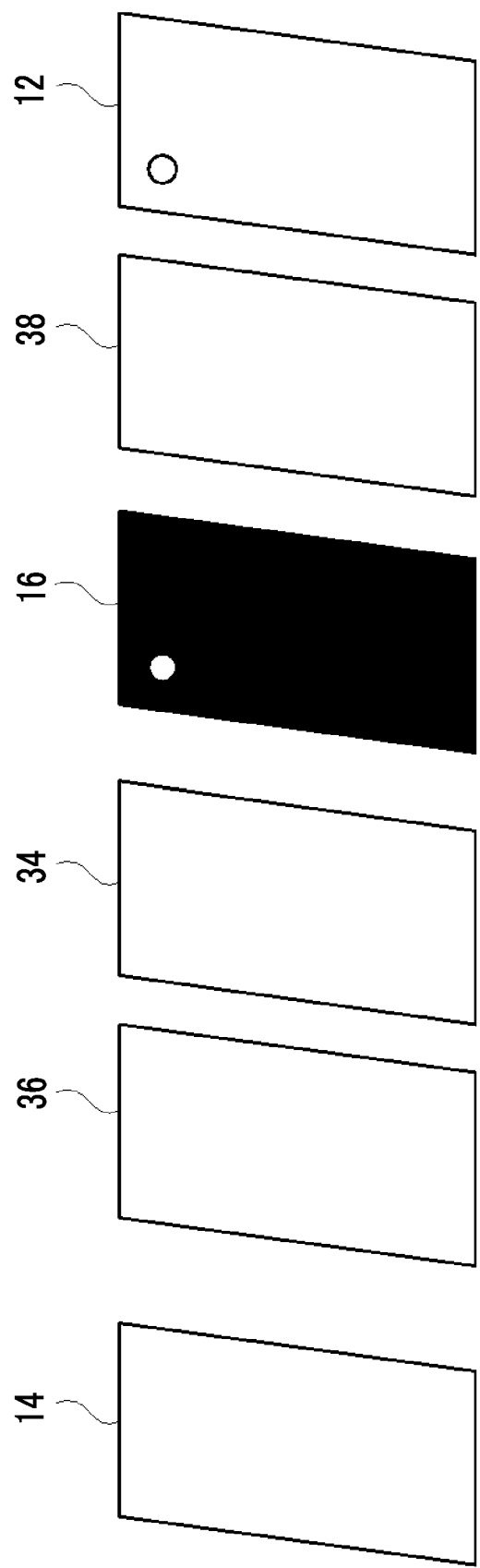
FIG. 20 is a schematic diagram illustrating a configuration of Example.

An imaging device was prepared using the same method as that of Example 1, except that the configuration of the laminate was adjusted as illustrated in FIG. 20 such that the cholesteric liquid crystal layer 14, the λ/4 plate 36, the linear polarizing plate 34, the blocking member 16 (black PET film), and the second λ/4 plate 38 were laminated in this order and bonded to each other.

Example 11

An imaging device was prepared using the same method as that of Example 9, except that a laminate product of a liquid crystal ½ wave plate and a liquid crystal ¼ wave plate (manufactured by Fujifilm Corporation) was used as the λ/4 plate 36.

Example 12

An imaging device was prepared using the same method as that of Example 9, except that a liquid crystal ¼ wave plate (manufactured by Fujifilm Corporation) was used as the λ/4 plate 36.

Example 13

An imaging device was prepared using the same method as that of Example 9, except that MCR140N (manufactured by MeCan Imaging Inc.) was used as the λ/4 plate 36.

Example 14

An imaging device was prepared using the same method as that of Example 9, except that MGR125 (manufactured by MeCan Imaging Inc.) was used as the λ/4 plate 36.

<Evaluation>
(Visibility)

Each of the imaging devices according to Examples and Comparative Example was observed by visual inspection to evaluate the visibility of the camera.

The evaluation was performed by 10 persons.

The number of persons who were able to recognize the camera in each of the imaging devices according to Examples 1 to 14 was zero. On the other hand, the number of persons who were able to recognize the camera in the imaging device according to Comparative Example 1 was 10.

(Clearness of Obtained Image)

Using the camera of each of the imaging devices according to Examples and Comparative Example, an image was obtained. The image obtained using the camera according to Comparative Example 1 was affected by the tint (red) of the colored cellophane. On the other hand, the image obtained in each of Examples 1 to 14 was clear without being affected by any tint.

Next, in order to investigate the influence of the λ/4 plate and the circularly polarizing plate on imaging, the laminates according to Examples 9 and 11 to 14 were extracted to measure light leak of the laminates using an ultravioletvisible-near infrared spectrophotometer. Here, the cholesteric liquid crystal layer 14 in each of the laminates according to Examples was measured at two levels: (i) blue reflection (reflection center wavelength: 450 nm); and (ii) red reflection (reflection center wavelength: 580 nm).

[Measurement Method]

<Measurement of λ/4 Plate and Phase Difference>

The λ/4 plate according to each of Examples was disposed on a stage of an AxoScan high-speed and high-accuracy Mueller matrix polarimeter (manufactured by Axometrics, Inc.) to measure a phase difference in a range of 400 nm to 700 nm. The measurement was performed while adjusting the tilt angle of the stage to two steps of 0° and 60°.

Table 1 shows a maximum value of |ΔRe (0)| in a wavelength range of 400 nm to 700 nm, a maximum value of |ΔRe (60)| in a wavelength range of 400 nm to 700 nm, |ΔRe (60,450)| at a wavelength of 450 nm, and |ΔRe (60,650)| at a wavelength of 650 nm. In addition, Table 1 shows the determination results on whether |ΔRe (0)|<50 is satisfied (Y) or not (N), whether |ΔRe (60)|<50 is satisfied or not, and whether |ΔRe (60,450)|<|ΔRe (60,650)| is satisfied or not.

TABLE 1

| | λ/4 plate | | | | | | |
|---|---|---|---|---|---|---|---|
| | \| ΔRe (0) \| | \| ΔRe (0) \| < 50 | \| ΔRe (60) \| | \| ΔRe (60) \| < 50 | \| ΔRe (60, 450) \| | \| ΔRe (60, 650) \| | \| ΔRe (60, 450) \| < \| ΔRe (60, 650) \| |
| Example 9 | 20 | Y | 48 | Y | 0 | 36 | Y |
| Example 11 | 41 | Y | 44 | Y | 40 | 12 | N |
| Example 12 | 68 | N | 76 | N | 4 | 65 | Y |
| Example 13 | 56 | N | 66 | N | 11 | 52 | Y |
| Example 14 | 56 | N | 78 | N | 4 | 64 | Y |

<Measurement of Circular Dichroism of Circularly Polarizing Plate>

The circularly polarizing plate according to each of Examples was disposed on a stage of an AxoScan high-speed and high-accuracy Mueller matrix polarimeter (manufactured by Axometrics, Inc.) such that the linear polarizing plate was positioned on the incidence side, and circular dichroism (CD) in a range of 400 nm to 700 nm was measured. The measurement was performed while adjusting the tilt angle of the stage to two steps of 0° and 60°.

Table 2 shows a minimum value of |D (0)| in a wavelength range of 400 nm to 700 nm, a minimum value of |D (60)| in a wavelength range of 400 nm to 700 nm, |D (60,450)| at a wavelength of 450 nm, and |D (60,650)| at a wavelength of 650 nm. In addition, Table 2 shows the determination results on whether |D (0)|>0.8 is satisfied (Y) or not (N), whether |D (60)|>0.8 is satisfied or not, and whether |D (60,450)|>|D (60,650)| is satisfied or not.

TABLE 2

| | Circularly Polarizing Plate | | | | | | |
|---|---|---|---|---|---|---|---|
| | \| D (0) \| | \| D(0) \| > 0.8 | \| D (60) \| | \| D (60) \| > 0.8 | \| D (60, 450)\| | \| D (60, 650) \| | \| D (60, 450) \| > \| D (60, 650) \| |
| Example 9 | 0.91 | Y | 0.82 | Y | 0.94 | 0.86 | Y |
| Example 11 | 0.98 | Y | 0.97 | Y | 0.97 | 0.99 | N |
| Example 12 | 0.83 | Y | 0.17 | N | 0.43 | 0.93 | N |
| Example 13 | 0.73 | N | 0.72 | N | 0.94 | 0.78 | Y |
| Example 14 | 0.65 | N | 0.74 | N | 0.95 | 0.79 | Y |

<Measurement of Transmittance of Decorative Laminate>

The laminate according to each of Examples was disposed such that the cholesteric liquid crystal layer side was positioned on the incidence side of an ultraviolet-visible-near infrared spectrophotometer and an automated absolute reflectance measurement system ARMN-735 (manufactured by JASCO Corporation), and the transmittance in a range of 400 nm to 700 nm was measured at two points where the sample stage was tilted to incidence angles of 0° to 60°.

In addition, as compared to a graph obtained by measurement using the linear polarizing plate (HLC-5618RE (manufactured by PANC Corporation)) alone, a case where the graph shape did not change was evaluated as A, and a case where a change in graph shape (scattering of a specific wavelength) was observed was evaluated as B. In a case where the graph shape was changed, light leak occurred.

The cholesteric liquid crystal layer 14 in each of the laminates was measured at two levels: (i) blue reflection (reflection center wavelength: 450 nm); and (ii) red reflection (reflection center wavelength: 580 nm).

The results are shown in Table 3.

TABLE 3

| | Light Leak of Laminate | | | |
|---|---|---|---|---|
| | Blue Reflection (Wavelength 450 nm) | | Red Reflection (Wavelength 580 nm) | |
| | 0° | 60° | 0° | 60° |
| Example 9 | A | A | A | A |
| Example 11 | A | A | A | B |
| Example 12 | A | A | A | B |
| Example 13 | B | A | A | A |
| Example 14 | B | A | A | A |

It can be seen that, in Example 9 in which the λ/4 plate satisfies |ΔRe (0)|<50, |ΔRe (60)|<50, and |ΔRe (60,450)|<|ΔRe (60,650)| and the circularly polarizing plate satisfies |D (θ)|>0.8, |D (60)|>0.8, and |D (60,450)|>|D (60,650)|, light leak did not occur both in the case of the cholesteric liquid crystal layer of blue reflection at the incidence angles of 0° and 60° and in the case of the cholesteric liquid crystal layer of red reflection at the incidence angles of 0° and 60°.

It can be seen that, in Examples 11 and 12 in which the λ/4 plate does not satisfy |ΔRe (0)|<50, |ΔRe (60)|<50, or |ΔRe (60,450)|<|ΔRe (60,650)| and the circularly polarizing plate does not satisfy |D (60)|>0.8 or |D (60,450)|>|D (60,650)|, the occurrence of light leak was observed in the case of the cholesteric liquid crystal layer of red reflection at the incidence angle of 60°. Since light leak did not occur at the incidence angle of 0°, there is no significant problem. However, for example, in a case where a wide angle lens is used, there may be an influence.

In Examples 13 and 14 in which the λ/4 plate does not satisfy |ΔRe (0)|<50 and |ΔRe (60)|<50 and the circularly polarizing plate does not satisfy |D (0)|>0.8 and |D (60)|>0.8, light leak occurred in the case of the cholesteric liquid crystal layer of blue reflection at the incidence angle of 0°.

As can be seen from the above results, the effects of the present invention are obvious.

EXPLANATION OF REFERENCES 10a to 10m: imaging device
12: imaging unit
14, 14R, 14G, 14B, 40: transflective film
16: blocking member
16a: opening
20: image pickup element
22: optical system
24: lens barrel
30: antireflection layer
32: circularly polarizing plate
34: linear polarizing plate
36, 38: λ/4 plate
42: first reflecting region
44: second reflecting region
46: box-shaped member
48: reflection uniformizing layer
50: decorative film
51a: coating film
51b: coating film a part of which is exposed
51c: exposed coating film
51d: heated coating film
S: exposure device
H: heater
UV: ultraviolet irradiation device

What is claimed is:

1. An imaging device comprising:
an imaging unit that includes an image pickup element and an optical system, wherein the optical system forms an image on the image pickup element and has an optical axis direction; and
a transflective film that is disposed on a side of the imaging unit where light is incident into the image pickup element and reflects a part of the incident light,
wherein the transflective film includes at least one of a cholesteric liquid crystal layer or a multi-layer polymer film,
in the optical axis direction of the optical system, a peripheral region surrounding the imaging unit satisfies L*50 in a CIE-Lab (D50) color space, and
in the optical axis direction of the optical system, the transflective film is disposed to cover at least the imaging unit and the peripheral region.

2. The imaging device according to claim 1,
wherein the transflective film includes a cholesteric liquid crystal layer.

3. The imaging device according to claim 1, further comprising:
a blocking member that is disposed between the imaging unit and the transflective film and has an opening at a position of the imaging unit in the optical axis direction of the optical system,
a peripheral region of the opening in the blocking member satisfies L*50 in the CIE-Lab (D50) color space, and
the transflective film is disposed to cover at least the opening and the peripheral region of the blocking member.

4. The imaging device according to claim 3,
wherein the blocking member is in contact with a layer on the transflective film side.

5. The imaging device according to claim 3, further comprising:
a reflection uniformizing layer that is disposed between the blocking member and the transflective film.

6. The imaging device according to claim 1, further comprising:
a box-shaped member that covers a surface side of the imaging unit opposite to the surface where light is incident into the image pickup element and a side surface side of the imaging unit and has one open surface, and
in the optical axis direction of the optical system, a region of the box-shaped member corresponding to the peripheral region satisfies L*50 in the CIE-Lab (D50) color space.

7. The imaging device according to claim 1, further comprising:
an antireflection layer that is disposed on the surface side of the imaging unit where light is incident into the image pickup element.

8. The imaging device according to claim 1, further comprising:
a λ/4 plate and a linear polarizing plate that are disposed on the surface side of the imaging unit where light is incident into the image pickup element.

9. The imaging device according to claim 8,
wherein in a case where a phase difference at an incidence angle θ° is represented by Re (θ) and an absolute value of a difference between a value of ¼×λ at an incidence wavelength λ nm and a value of the phase difference is represented by |ΔRe (θ)|=|¼×λ−Re (θ)|, the λ/4 plate constantly satisfies |ΔRe (0)|<50 at any wavelength of 400 nm to 700 nm.

10. The imaging device according to claim 8,
wherein in a case where a phase difference at an incidence angle θ° is represented by Re (θ) and an absolute value of a difference between a value of ¼×λ at an incidence wavelength λ nm and a value of the phase difference is represented by |ΔRe (θ)|=|¼λ-Re (θ)|, the λ/4 plate constantly satisfies |ΔRe (60)|<50 at any wavelength of 400 nm to 700 nm, and
in a case where a phase difference at an incidence angle θ° and an incidence wavelength λ nm is represented by ΔRe (θ,λ) and an absolute value of a difference between a value of ¼×λ at each wavelength and a value of the phase difference is represented by |ΔRe (θ,λ)|=|¼×λ-Re (θ,λ)|, the λ/4 plate satisfies |ΔRe (60,450)|<|ΔRe (60,650)|.

11. The imaging device according to claim 8, further comprising
a second λ/4 plate that is disposed between the imaging unit and the linear polarizing plate or the circularly polarizing plate.

12. The imaging device according to claim 11, further comprising
an antireflection layer or a reflection uniformizing layer that is disposed between the imaging unit and the second λ/4 plate.

13. The imaging device according to claim 1,
wherein the transflective film includes a cholesteric liquid crystal layer, and
the imaging device further comprises a circularly polarizing plate that is disposed between the blocking member and the transflective film.

14. The imaging device according to claim 13,
wherein in a case where a circular polarization degree of the circularly polarizing plate at an incidence angle θ° is represented by $D(\theta)$ and an absolute value of the circular polarization degree is represented by $|D(\theta)|$, the circularly polarizing plate constantly satisfies $|D(0)|>0.8$ at any wavelength of 400 nm to 700 nm.

15. The imaging device according to claim 13,
wherein in a case where a circular polarization degree of the circularly polarizing plate at an incidence angle θ° is represented by $D(\theta)$ and an absolute value of the circular polarization degree is represented by $|D(\theta)|$, the circularly polarizing plate constantly satisfies $|D(60)|>0.8$ at any wavelength of 400 to 700 nm, and
in a case where a circular polarization degree of the circularly polarizing plate at an incidence angle θ° and an incidence wavelength λ mn is represented by $D(\theta,\lambda)$ and an absolute value of the circular polarization degree is represented by $|D(\theta,\lambda)|$, the circularly polarizing plate constantly satisfies $|D(60,450)|>|D(60,650)|$.

16. The imaging device according to claim 1,
wherein the transflective film includes a cholesteric liquid crystal layer, and
the cholesteric liquid crystal layer includes two or more reflecting regions having different selective reflection wavelengths.

17. A laminate comprising:
a blocking member having at least one opening; and
a transflective film,
wherein the transflective film includes at least one of a cholesteric liquid crystal layer or a multi-layer polymer film, and
in a direction perpendicular to a principal plane of the blocking member, a peripheral region surrounding the opening satisfies L*≤50 in a CIE-Lab (D50) color space.

* * * * *